United States Patent [19]
Nishimura et al.

[11] Patent Number: 6,119,250
[45] Date of Patent: Sep. 12, 2000

[54] SEMICONDUCTOR INTEGRATED CIRCUIT

[75] Inventors: Kazuko Nishimura, Kyoto; Hironori Akamatsu, Osaka; Akira Matsuzawa, Kyoto; Mitsuyasu Ohta, Osaka, all of Japan

[73] Assignee: Matsushita Electric Industrial Co., Ltd., Osaka, Japan

[21] Appl. No.: 09/083,389

[22] Filed: May 22, 1998

Related U.S. Application Data

[63] Continuation of application No. 08/888,920, Jul. 7, 1997, Pat. No. 5,978,948.

[30] Foreign Application Priority Data

| May 7, 1996 | [JP] | Japan | 8-175304 |
| May 23, 1997 | [JP] | Japan | 9-133369 |

[51] Int. Cl.$^7$ .................................................. G11C 29/00
[52] U.S. Cl. ................................. 714/718; 365/201
[58] Field of Search ............................. 714/718, 724, 714/736, 733, 735; 365/201

[56] References Cited

U.S. PATENT DOCUMENTS 5,636,163  6/1997  Furutanu et al. ............... 365/189.1

FOREIGN PATENT DOCUMENTS

| 57-087149 | 5/1982 | Japan . |
| 62-154638 | 7/1987 | Japan . |
| 04055778 | 2/1992 | Japan . |
| 06160487 | 6/1994 | Japan . |
| 06334010 | 12/1994 | Japan . |
| 07038417 | 2/1995 | Japan . |
| 7-38417 | 2/1995 | Japan . |

OTHER PUBLICATIONS

Y. Matsuya, et al., "1V, 10MHz High–Speed Digital Circuit Technology with Multi–Threshold CMOS", Technical Report of IEICE, ICD93–107, pp. 23–27, 1993–10.

C.Q. Tong, et al., "IDDQ Testing in Low Power Supply CMOS Circuits", Proc. of IEEE 1996 Custom Integrated Circuits Conference, pp. 467–470, 1996.

T. Kuroda, "A High–Speed Low Power 0.3 $\mu$m CMOS Gate Array with Variable Threshold Voltage (VT) Scheme", Proc. of IEEE 1996 Custom Integrated Circuits Conference, pp. 53–56, 1996.

T. Kuroda, et al., A 0.9V 150 HMz 10mW 4mm$^2$ 2–D discrete Cosine Transform Core Processor with Variable–Threshold–voltage Scheme, Proc. of 1996 IEEE International Sold–State Circuits Conference, pp. 166–167, 1996.

*Primary Examiner*—Hoa T. Nguyen
*Attorney, Agent, or Firm*—McDermott, Will & Emery

[57] ABSTRACT

A test-target circuit is constructed of circuit blocks each comprising low-Vth MOS transistors including address buffers and a timing generator. A test enable signal for indication of a test, an operation selection signal for indication of an operation, and a block selection signal used to select a desired circuit block are provided. A high-Vth NMOS and a high-Vth PMOS transistor are provided in order to provide to a test circuit one of detected currents of the circuit blocks that was selected by placing a block selection signal and the test enable signal in the state of HIGH.

11 Claims, 19 Drawing Sheets

SEMICONDUCTOR INTEGRATED CIRCUIT

This application is a continuation of Ser. No. 08,888,920 filed Jul. 7, 1997 now U.S. Pat. No. 5,978,948.

BACKGROUND OF THE INVENTION

The invention relates to semiconductor integrated circuits that have a circuit for use in self-testing and self-fault-restoring.

There have been strong demands for low-power semiconductor integrated circuits for achieving reductions in the dimensions of semiconductor devices for improving the level of integration of semiconductor devices. The reduction of power supply voltage is an effective way of implementing semiconductor integrated circuits with low power consumption. The problem is that reductions in power supply voltage result in slow transistors. A solution to this problem has been proposed. An MT-CMOS integrated circuit, as one of semiconductor integrated circuits formed by CMOS integrated circuits, has been known in the art. In the MT-CMOS integrated circuit, two types of MOS transistors are employed, namely MOS transistors having a low threshold voltage (Vth), called low-threshold MOS transistors and MOS transistors having a high Vth, called high-threshold MOS transistors.

An MT-CMOS integrated circuit is reported in TECHNICAL REPORT OF IEICE, ICD93-107 (1993-10) of THE INSTITUTE OF ELECTRONICS, INFORMATION AND COMMUNICATION ENGINEERS, which is described with reference to FIG. 1.

FIG. 1 is a circuit diagram which outlines a part of an MT-CMOS integrated circuit. Referring to FIG. 13, logic gate 99, in which many low-threshold transistors (LVth-Tr's) are placed, is connected between power supply terminal 100 at which the operation voltage (VDD) is provided and grounding terminal 101 at which the grounding potential (VGN) is provided. Connected between power supply terminal 100 and logic gate 99 is a p-channel, high-threshold transistor (pHVth-Tr 91). Further, connected between logic gate 99 and grounding terminal 101 is an n-channel, high-threshold transistor (nHVth-Tr 92). Transistors 93–96, contained in logic gate 99, are low-threshold transistors, therefore having the ability to operate at high speed and perform arithmetic operations at high speed, but on the other hand, a large leakage current will flow therein. This may lead to an increase in power consumption. To cope with this problem, HVth-Tr 91 is placed between logic gate 99 and terminal 100 and HVth-Tr 92 is placed between logic gate 99 and terminal 101.

The operation of the MT-CMOS integrated circuit of FIG. 1 is described. The electric potential of node 97 between logic gate 99 and pHVth-Tr 91 is the virtual power supply potential (VDDV), while the electric potential of node 98 between logic gate 99 and nHVth-Tr 92 is the virtual grounding potential (VGNV). Electric charges are applied to node 97 that acts as a virtual power supply terminal and to node 98 that acts as a virtual grounding terminal by having HVth-Tr 91 and HVth-Tr 92 placed in the ON state during the operation period of logic gate 99, whereby logic gate 99 formed of LVth-Tr's 93–96 starts operating at high speed. On the other hand, the supply of voltage from terminal 100 to logic gate 99 is cut off by having HVth-Tr 91 placed in the OFF state during the standby period, and HVth-Tr 92 turns off thereby suppressing leakage current from logic gate 99 to terminal 101 during the standby period. As a result, leakage from terminal 100 to terminal 101 can be held considerably low.

In a CMOS integrated circuit constructed of a PMOS circuit and an NMOS circuit, only one of them is placed in the ON state when the CMOS integrated circuit is in operation, and therefore the dissipation of power is low. When faults and/or defects, such as bridging between wires, occur in CMOS integrated circuits, power consumption is increased on the order of a few digits. This is utilized in methods, such as standby current testing and IDDQ testing, for detecting faults by observing increases in the value of electric current at the time of testing LSIs formed of CMOS integrated circuits.

As previously mentioned, with the reduction in LSI supply voltage with a view to reducing power consumption as low as possible, the reduction of Vth for MOS transistors disposed in CMOS integrated circuits has been strongly demanded in order to secure a satisfactory operating speed. However, for the case of MOS transistors low in Vth, there occurs an increase in leakage current in the standby state. To cope with such a problem, two techniques have been developed for the reduction of power consumption during the standby period. One technique employs a configuration for CMOS integrated circuits for increasing the Vth of respective MOS transistors in the standby state by substrate voltage control, i.e., a so-called variable threshold-voltage CMOS integrated circuits (VT-CMOSs) configuration. On the other hand, the other technique employs the foregoing MT-CMOS integrated circuit configuration for CMOS integrated circuits, in other words a CMOS integrated circuit configuration is provided in which a circuit of low-Vth MOS transistors is placed in the OFF state during the standby period using high-Vth MOS transistors. The MT-CMOS integrated circuit configuration has the advantage over the VT-CMOS integrated circuit configuration in that it can achieve faster switching from operation mode to standby mode.

The above-described MT-CMOS integrated circuit configuration however has the problem that the amount of leakage current occurring in standby mode increases due to each of low-Vth MOS transistors forming a CMOS integrated circuit. The proportion of an incremental amount of abnormal current accompanied with abnormal conditions (faults and/or defects) is therefore reduced, which makes it difficult to detect faults at test time. Testing including IDDQ testing is difficult to carry out.

SUMMARY OF THE INVENTION

Bearing in mind the above-described problems with the prior art techniques, the invention was made. Accordingly, an object of the invention is to provide a novel semiconductor integrated circuit containing therein MOS circuits constructed of low-Vth transistors, the semiconductor integrated circuit being capable of detecting an increase in the amount of electric current caused by an abnormal condition taking place in a MOS circuit.

Arrangements are made in order to achieve the object of the invention, in which a circuit of low-Vth MOS transistors that is tested is divided into a plurality of circuit blocks and high-Vth MOS transistors for turning off the circuit blocks during the normal standby mode of operation are utilized also at the time of testing for leakage current. In other words, it is arranged for each circuit block that a circuit current in each circuit block is directed to a test circuit through a high-Vth MOS transistor.

In accordance with the invention, a circuit block that is tested is selected using a high-Vth MOS transistor disposed for switching off power at standby time, and a supply current in a circuit of low-Vth MOS transistors is detected for each selected circuit block, and the detected supply current is compared with a reference value to determine whether it is acceptable or not. As a result of such arrangement, the number of circuit blocks that are tested at one time during the test mode of operation is limited, whereupon testing including IDDQ testing can be implemented by detecting an increase in the supply current due to faults and/or defects in low-Vth MOS transistors.

In accordance with the invention, a circuit block is tested to determine presence or absence of a fault therein by leakage current testing, and if the circuit block is faulty, then such a faulty circuit block is replaced by a previously-prepared spare circuit block.

As a result of such arrangement of replacing a faulty circuit block with a spare circuit block, it becomes possible to correct existing faults. This provides improvements in the yield of semiconductor integrated circuits. Additionally, since leakage current is judged per circuit block, this makes it possible to easily specify a circuit block in which a leakage current in excess of the reference value flows. Accordingly, this invention provides a semiconductor integrated circuit capable of circuit block evaluation, fault analysis, and other similar operations.

PREFERRED EMBODIMENTS OF THE INVENTION

EXAMPLE 1

Figure 1:
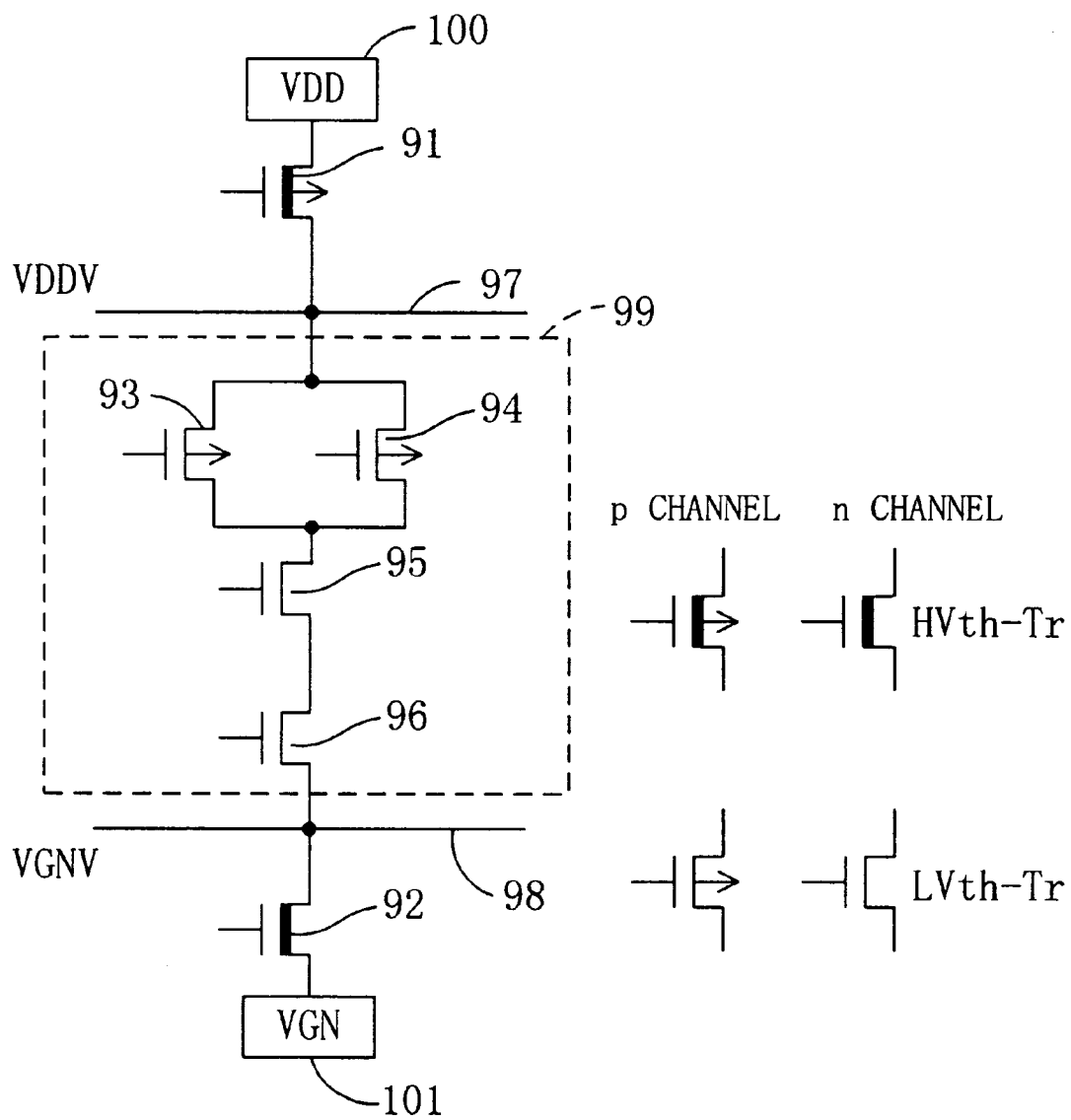
FIG. 1 is an electric circuit diagram of a typical MT-CMOS integrated circuit in accordance with the prior art technique.
Figure 2:
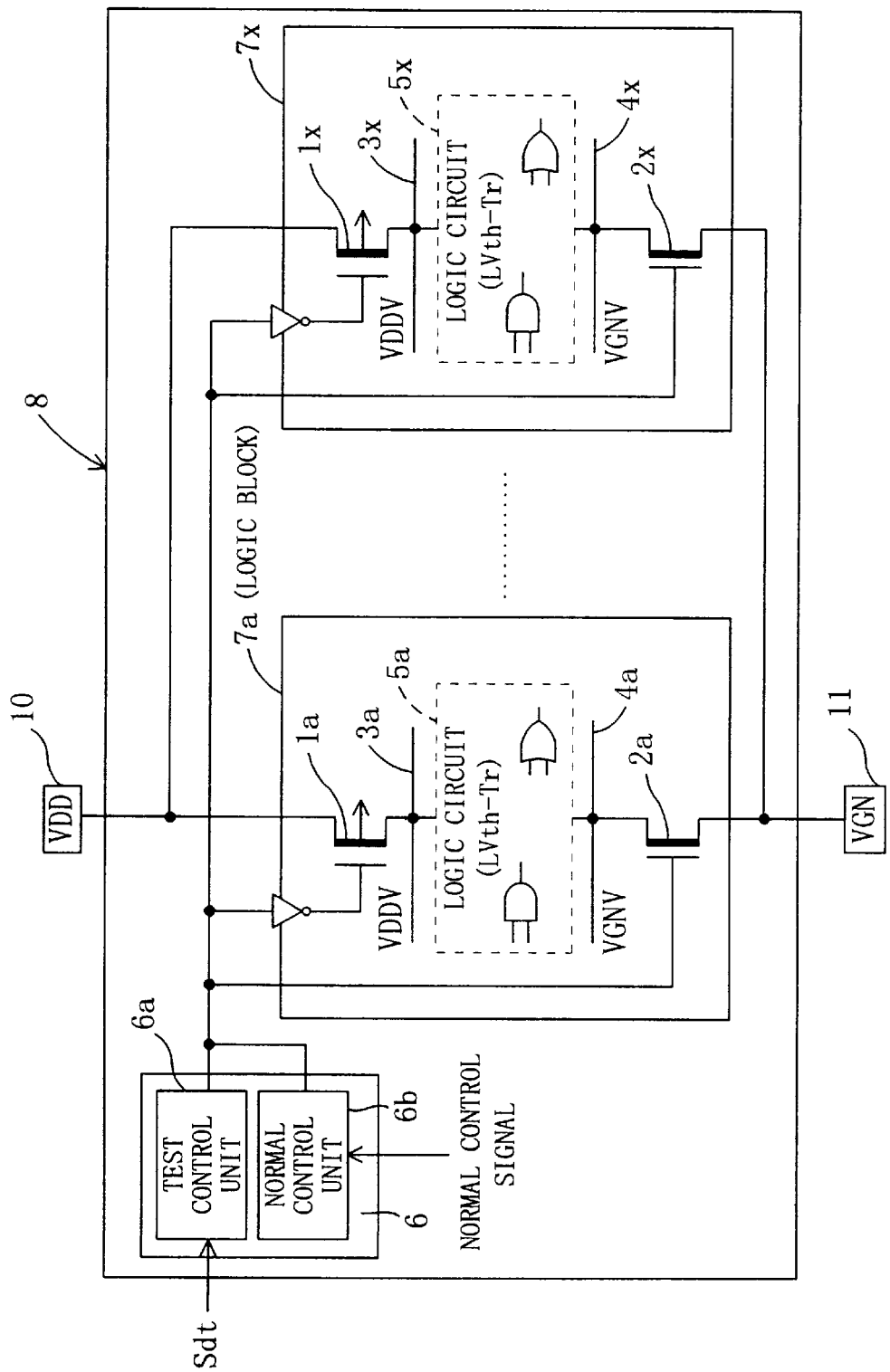
FIG. 2 is an electric circuit diagram of an MT-CMOS integrated circuit belonging to the first embodiment of the invention.

A first embodiment of this invention is described. FIG. 2 is an electric circuit diagram of an MT-CMOS integrated circuit system of the first embodiment.

Semiconductor integrated circuit 8, shown in FIG. 2, has logic blocks 7a–7x formed of MT-CMOS integrated circuits. Logic blocks 7a–7x have logic circuits 5a–5x, respectively. Each logic circuit 5a–5x is formed of many low-threshold transistors (LVth-Tr's) and is connected between power supply terminal 10 at which VDD is provided and grounding terminal 11 at which VGN is provided. Connected between each of logic circuits 5a–5x and terminal 10 are p-channel, high-threshold transistors (pHVth-Tr's) 1a–1x. On the other hand, connected between each of logic circuits 5a–5x and terminal 11 are n-channel, high-threshold transistors (nHVth-Tr's) 2a–2x. The electric potential of first nodes 3a–3x between pHVth-Tr's 1a–1x and logic circuits 5a–5x is VDDV (the virtual power supply potential). On the other hand, the electric potential of second nodes 4a–4x between nHVth-Tr's 2a–2x and logic circuits 5a–5x is VGNV (the virtual grounding potential). Semiconductor integrated circuit 8 is provided with state control unit 6. State control unit 6 has test control unit 6a. In response to a test signal (Sdt) for testing components other than logic circuits 5a–5x, i.e., each HVth-Tr and wires, test control unit 6a disconnects logic circuits 5a–5x from terminals 10 and 11 and, as a result, logic circuits 5a–5x each enter the standby state. State control unit 6 further has normal control unit 6b. In response to a normal control signal applied from inside semiconductor integrated circuit 8, normal control unit 6b controls the operation of the low-threshold transistors of the logic blocks. In the present embodiment, power supply and grounding terminals 10 and 11 common to logic blocks 7a–7x are provided and, during the test period, test control unit 6a of state control unit 6 controls all of pHVth-Tr's 1a–1x and nHVth-Tr's 2a–2x in logic blocks 7a–7x to go into the OFF state at the same time. According to the normal control signal, each HVth-Tr is controlled, by normal control unit 6b, to turn on during the operation period of logic blocks 7a–7x or to turn off during the standby period.

A technique of testing semiconductor integrated circuit 8 having the above-described organization is now described with reference to FIGS. 3 and 4.

Figure 3:
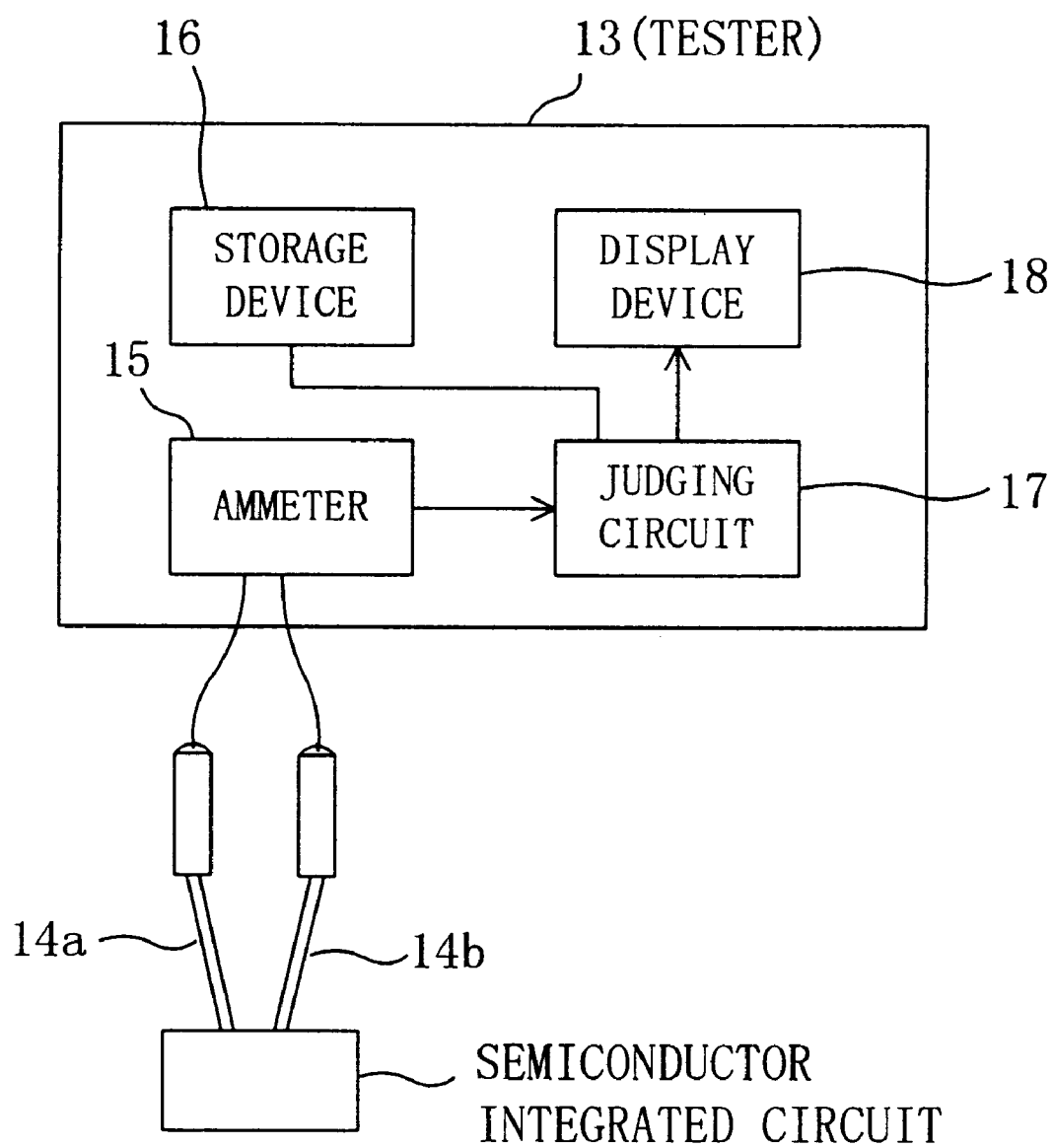
FIG. 3 outlines in block form a test device belonging to the first to sixth embodiments of the invention.

FIG. 3 outlines in block form the organization of tester 13 for testing semiconductor integrated circuits for use in the first to sixth embodiments. As shown in the figure, tester 13 has probes 14a and 14b which are brought into contact with both ends of a part of semiconductor integrated circuit 8, ammeter 15 that is connected to probes 14a and 14b, storage device 16 which stores a predetermined set value, judgement circuit 17 which determines whether a target of testing is acceptable or unacceptable, and display device 18 which receives a signal indicative of a judgement result from judgement circuit 17 and displays the result. At the time of testing semiconductor integrated circuit 8, probes 14a and 14b are brought into contact with a location defined between terminals 10 and 11, to detect, for example, an HVth-Tr failure.

Figure 4:
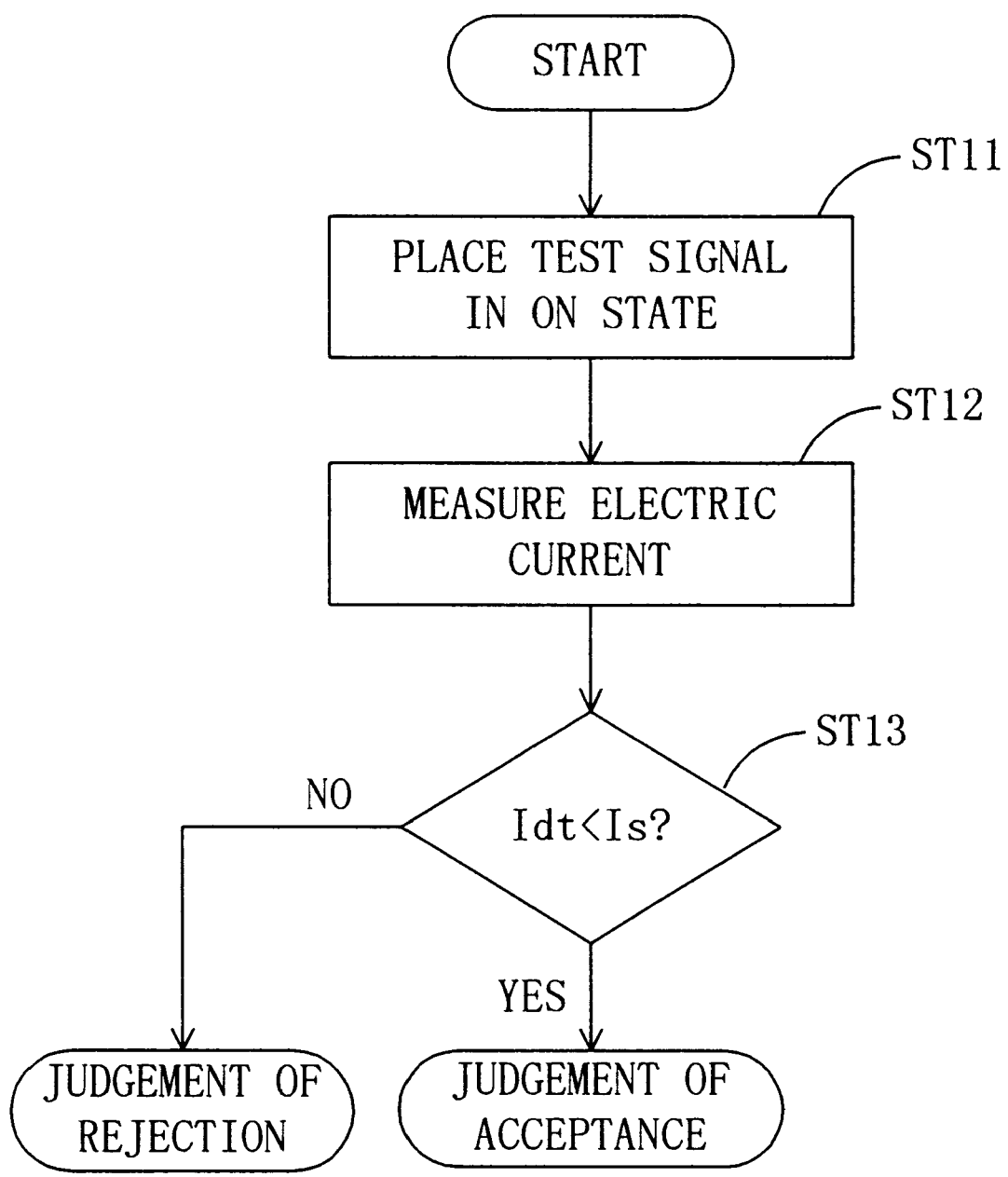
FIG. 4 is a flow chart showing a test procedure belonging to the first embodiment of the invention.

FIG. 4 is a flow chart showing a test procedure of the present embodiment. In step ST11, when the test signal Sdt goes into the ON state, pHVth-Tr's 1a–1x and nHVth Tr's 2a–2x of logic blocks 7a–7x are controlled by test control unit 6a to turn off. If pHVth-Tr's 1a–1x and nHVth Tr's 2a–2x enter the OFF state in normal manner, this have logic circuits 5a–5x placed in the standby state, in other words logic circuits 5a–5x are disconnected from power supply and grounding terminals 10 and 11.

In step ST12, an electric current flowing in a path is measured. Such measurement may be carried out at the side of power supply terminal 10 or at the side of grounding terminal 11.

In step ST13, a check is made to determine whether Idt (the detected value of a leakage current when signal Sdt is in the OFF state) is below Is (the predetermined set value). If Idt is less than Is, this means "accepted". If Idt is equal to or greater than Is, this means "rejected". The set value, Is, is given by:

$$Is = I + K1$$

where I is the electric current that flows under normal conditions and K1 is the constant allowing for characteristic variations occurring in the fabrication. The set value, Is, is stored in storage device 16.

In accordance with the present embodiment, it is possible to determine whether a logic block in the MT-CMOS integrated circuit makes a transition to the standby state during the test period, in other words it is possible to effectively detect a faulty product that fails to operate normally due to the malfunction of high-threshold transistors or due to the short-circuiting of wires of the MT-CMOS integrated circuit. Wire short-circuit that is detected by the present test is wire short-circuit occurring outside logic circuits 7a–7x, such as a short-circuit occurring between source terminals of pHVth- and nHVth-Tr's connected to the same logic circuit (for example, pHVth-Tr 1a and nHVth-Tr 2a connected to logic circuit 7a), and a short-circuit occurring between the source and drain of an HVth-Tr when the HVth-Tr's are provided at one side only.

In this way, faulty products are screened and only MT-CMOS integrated circuits free from defects are selected and shipped from the factory. The present embodiment has been described in terms of an MT-CMOS integrated circuit including a plurality of logic blocks formed of MT-CMOS integrated circuits. The invention may be embodied in an MT-CMOS integrated circuit including only one logic block formed of MT-CMOS integrated circuits.

In accordance with the present embodiment, state control unit 6 is placed outside logic blocks 7a–7x. State control unit 6 may be placed in each logic block 7a–7x.

In accordance with the present embodiment, it is designed such that the test signal Sdt is applied directly from outside semiconductor integrated circuit 8 to test control unit 6a of state control unit 6. The test signal Sdt may be generated within each logic block 7a–7x, and the same effects can be obtained. Further, in accordance with the present embodiment, the normal control signal is generated within semiconductor integrated circuit 8. The normal control signal may be applied from outside semiconductor integrated circuit 8, that is, from outside the semiconductor chip.

EXAMPLE 2

Figure 5:
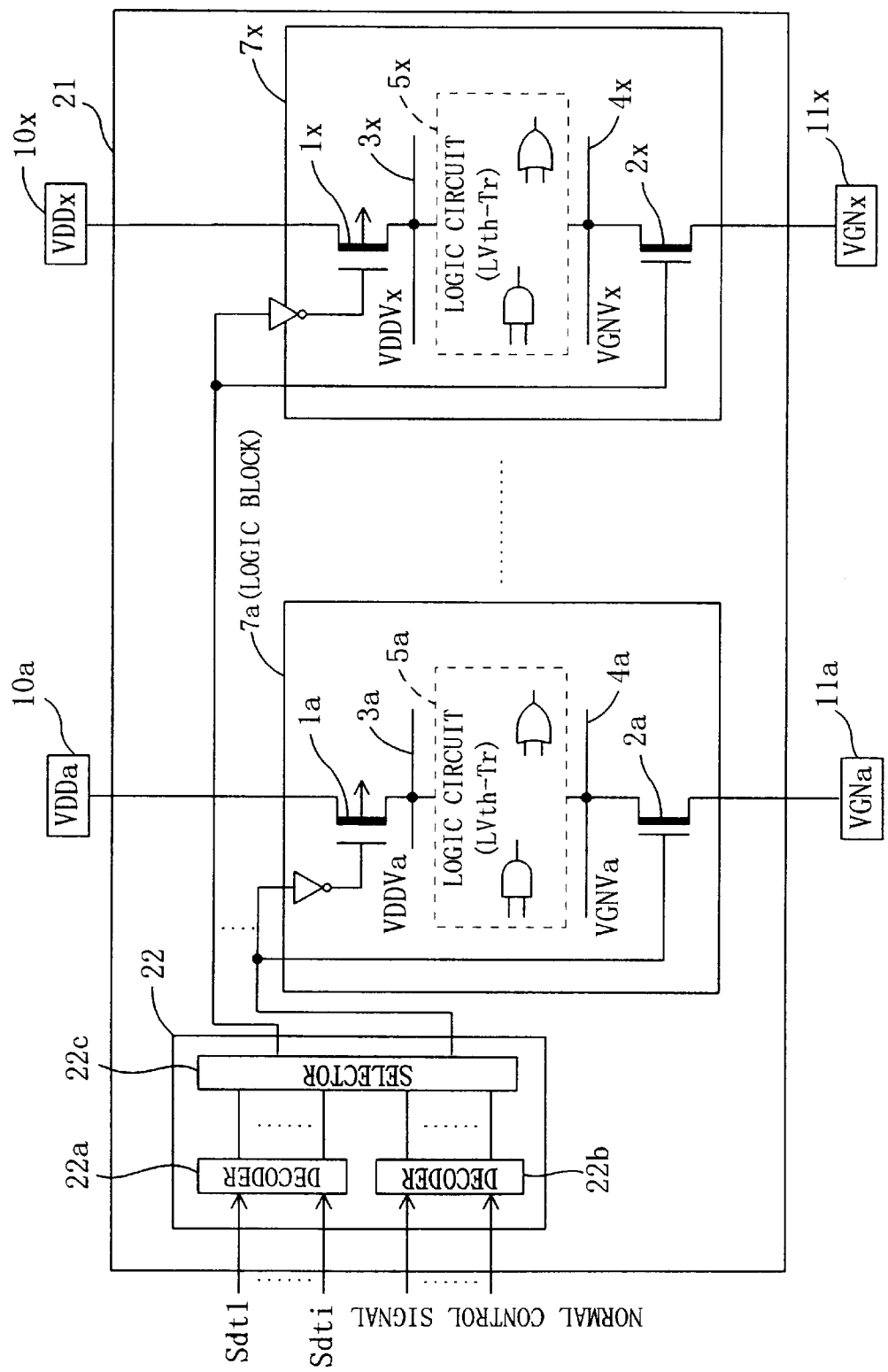
FIG. 5 is an electric circuit diagram of an MT-CMOS semiconductor integrated circuit belonging to the second embodiment of the invention.
Figure 6:
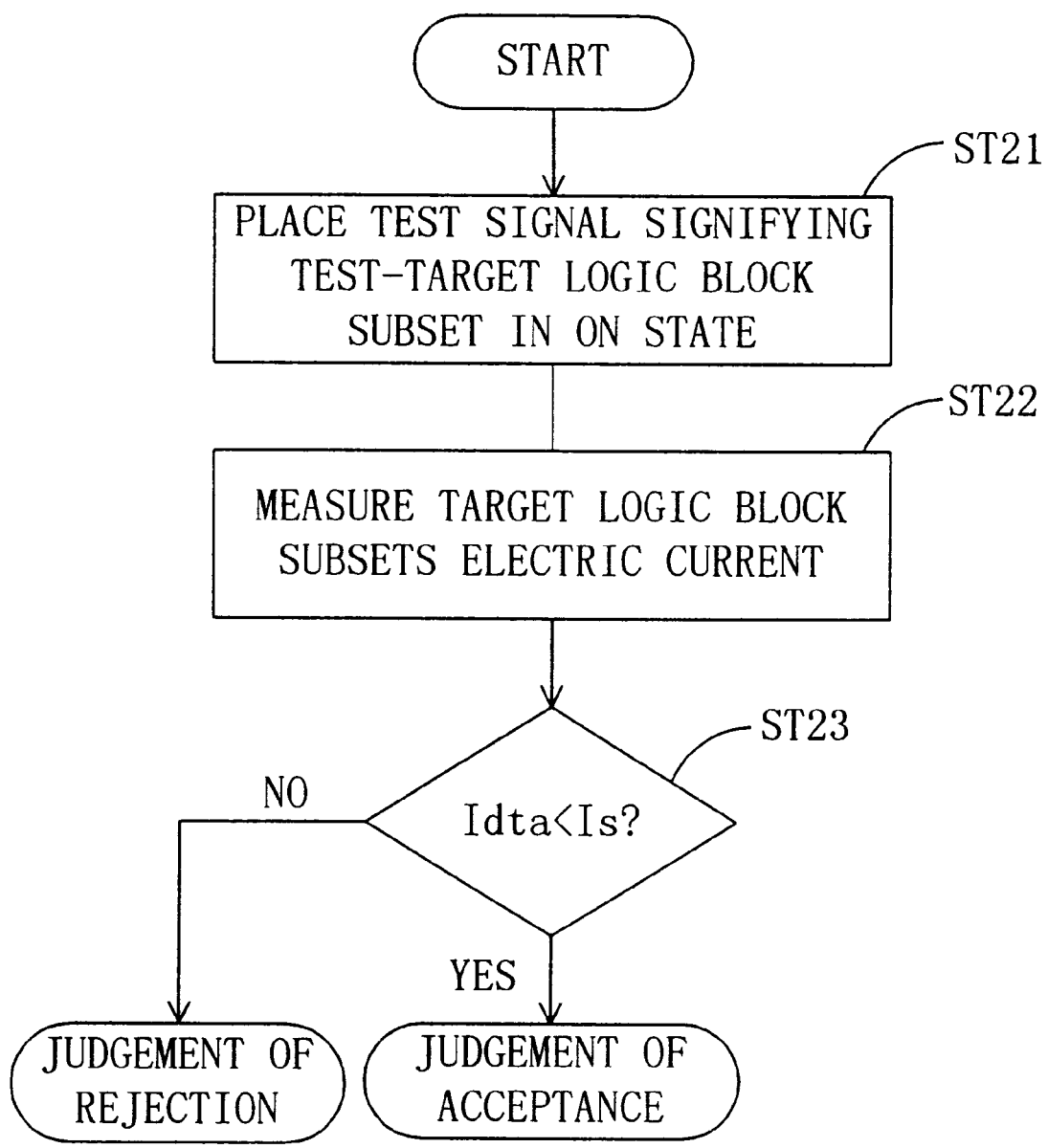
FIG. 6 is a flow chart showing a test procedure belonging to the second embodiment.

A second embodiment of the invention is now described by reference to FIGS. 5 and 6. FIG. 5 is an electric circuit diagram which outlines an organization of MT-CMOS integrated circuit 21 according to the present embodiment. FIG. 6 is a flow chart showing a test procedure for semiconductor integrated circuit 21.

MT-CMOS integrated circuit 21 shown in FIG. 5 has logic blocks 7a–7x formed of MT-CMOS integrated circuits, and state control unit 22. State control unit 22 is described. Having received test signals Sdtl–Sdti, state control unit 22 controls pHVth- and nHVth-Tr's, which are contained in one or more logic blocks (hereinafter called a subset of logic blocks) of logic blocks 7a–7x subjected to testing, to turn off. State control unit 22 has decoder 22a which receives the test signals Sdtl–Sdti, decoder 22b which receives the normal control signals, and selector 22c which selects between the output from decoder 22a and the output from decoder 22b. According to a combination of Sdtl–Stdi, decoder 22a provides a signal that has pHVth- and nHVth-Tr's within a test-target logic block subset of logic blocks 7a–7x placed in the OFF state. Selector 22c selects, based on a mode switch signal indicative of test mode or normal control mode, between the test signal and the normal control signal. Selector 22c then provides a selection.

Logic blocks 7a–7x are provided with their respective power supply and grounding terminals 10a–10x and 11a–11x. It is to be noted that each logic block of the present embodiment is identical in internal organization with a corresponding one of the first embodiment.

The test apparatus of the present embodiment is basically identical in organization with that of the first embodiment shown in FIG. 3. The value of electric current is detected by bringing probes 14a and 14b of FIG. 3 into contact with, for example, external pins. The set value, Is, is given by:

$$Is = I + Kk$$

where Kk is the constant allowing for characteristic variations occurring in the fabrication. The electric potential of grounding terminals 11a–11x is assumed to be zero.

A test procedure is described with reference to the FIG. 6 flow chart.

In step ST21, a combination of test signals that signifies a test-target logic block subset, is fed to decoder 22a of state control unit 22. Suppose that logic block 7a is designated in the present embodiment. If either pHVth-TR 1a or nHVth-Tr 2a operates normally, the target logic block subset 7a is disconnected from power supply terminal 10a or grounding terminal 11a to enter the standby state.

Next, in step ST22, Idta, which is the electric current value of logic block subset 7a, is measured at locations on the side of power supply terminal 10a or on the side of grounding terminal 11a.

Step ST23 determines whether the detected current value Idta less than the set value Is. If Idta is determined to be less than Is, this means "accepted". On the other hand, if Idta is determined to be equal to or greater than Is, this means "rejected".

In the event that a different logic block subset, for example, logic block subset 7x, is designated to be a test-target logic block subset, the current value of logic block subset 7x is measured to determine whether pHVth-Tr 1x or nHVth-Tr 2x of logic block subset 7x operates normally, in other words whether the detected current value Idtx is less than the set value Is is determined. If Idtx is determined to be less than Is, this means "accepted". On the other hand, if Idtx is determined to be equal to or greater than Is, this means "rejected".

Like the first embodiment, it is possible for the present embodiment to determine whether an MT-CMOS integrated circuit is acceptable or not. Particularly, the present embodiment provides the advantage that, even when logic block subsets have different power supply voltages, it is still possible to determine, without fail, whether test-target logic block subsets are acceptable or unacceptable.

In the present embodiment, each of logic blocks 7a–7x formed of MT-CMOS integrated circuits is provided with power supply terminal 10 and grounding terminal 11. However, power supply terminals 10 and grounding terminals 11 may be arranged to one logic block subset, for example, logic block subset 7a. Alternatively, a power supply and grounding terminals common between a plurality of logic blocks that belong in the same logic block subset may be provided, which achieves the same effects as the present embodiment.

In accordance with the present embodiment, state control unit 22 is arranged outside logic blocks 7a–7x. State control unit 22 may be formed within each logic block.

Further, in the present embodiment, it is arranged such that the test signals Sdtl–Sdti are fed to decoder 22a of state control unit 22 from outside semiconductor integrated circuit 8; however, these signals may be generated within logic blocks 7a–7x of semiconductor integrated circuit 8. Furthermore, in the present embodiment, the normal control signal is applied from outside semiconductor integrated circuit 8; however, the normal control signal may be generated outside semiconductor integrated circuit 8, that is, inside the semiconductor chip.

EXAMPLE 3

Figure 7:
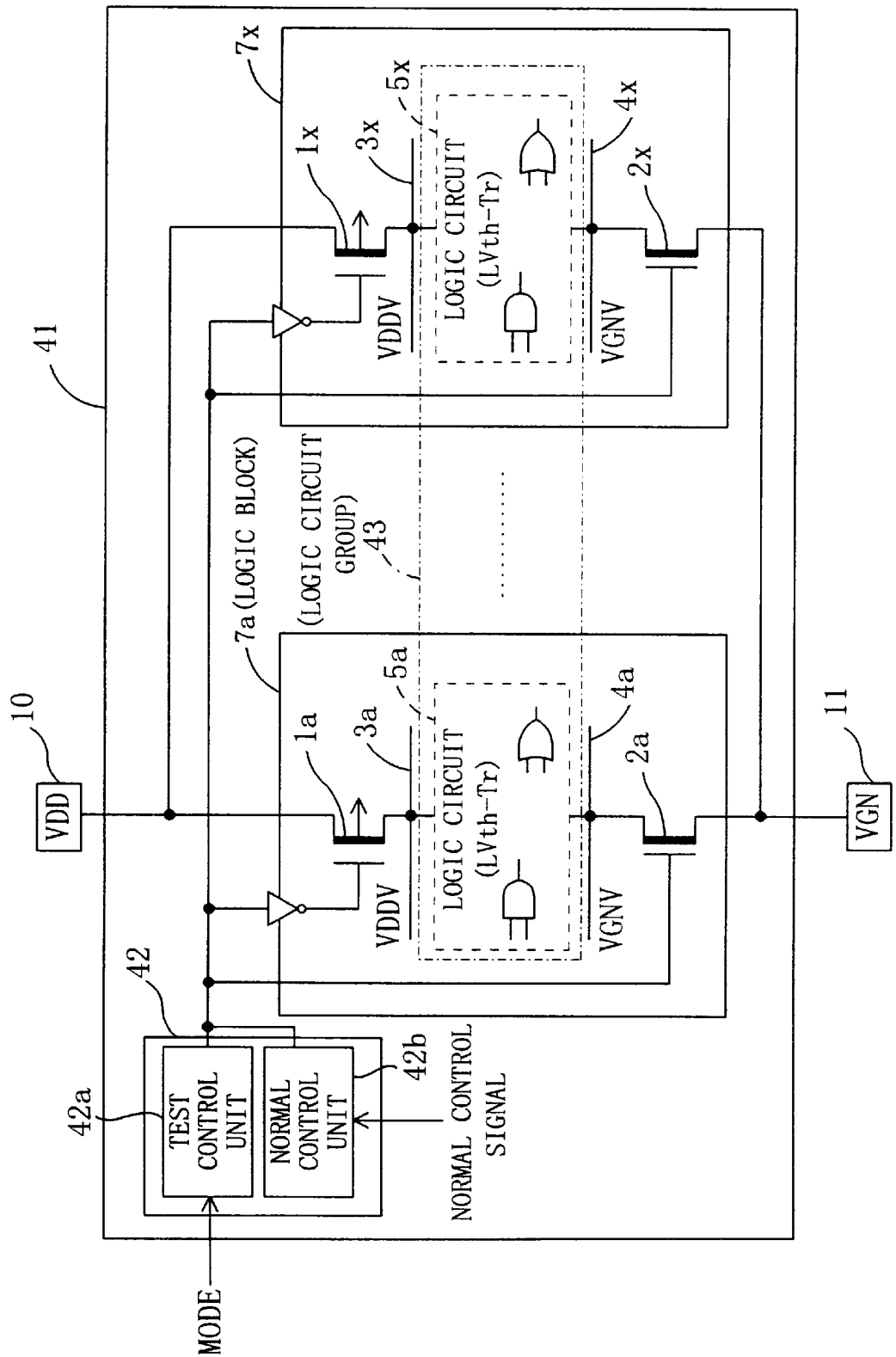
FIG. 7 is an electric circuit diagram of an MT-CMOS integrated circuit belonging to the third embodiment of the invention.

A third embodiment of the invention relates to a method for generating a test sequence for a semiconductor integrated circuit. FIG. 7 is an electric circuit diagram showing an organization of MT-CMOS integrated circuit 41 in accordance with the present embodiment.

Semiconductor integrated circuit 41 of the present embodiment has basically the same organization as semiconductor integrated circuit 8 of the first embodiment shown in FIG. 2. In the present embodiment, state control unit 42 is provided. State control unit 42 includes test control unit 42a. When the state control signal MODE is at "1" during the logic circuit test period, test control unit 42a controls the entirety of a logic circuit group 43, which is formed of logic circuits 5a–5x of logic blocks 7a–7x which is a target of testing, to connect with terminals 10 and 11 (the power supply terminal and the grounding terminals). In the present embodiment, when the state control signal MODE is at "1", this means that logic circuit group 43 is in the ON state. Like each of the foregoing embodiments, normal control unit 42b is arranged in state control unit 42 for controlling the normal operation of logic circuit group 43 according to the normal control signal.

Figure 8:
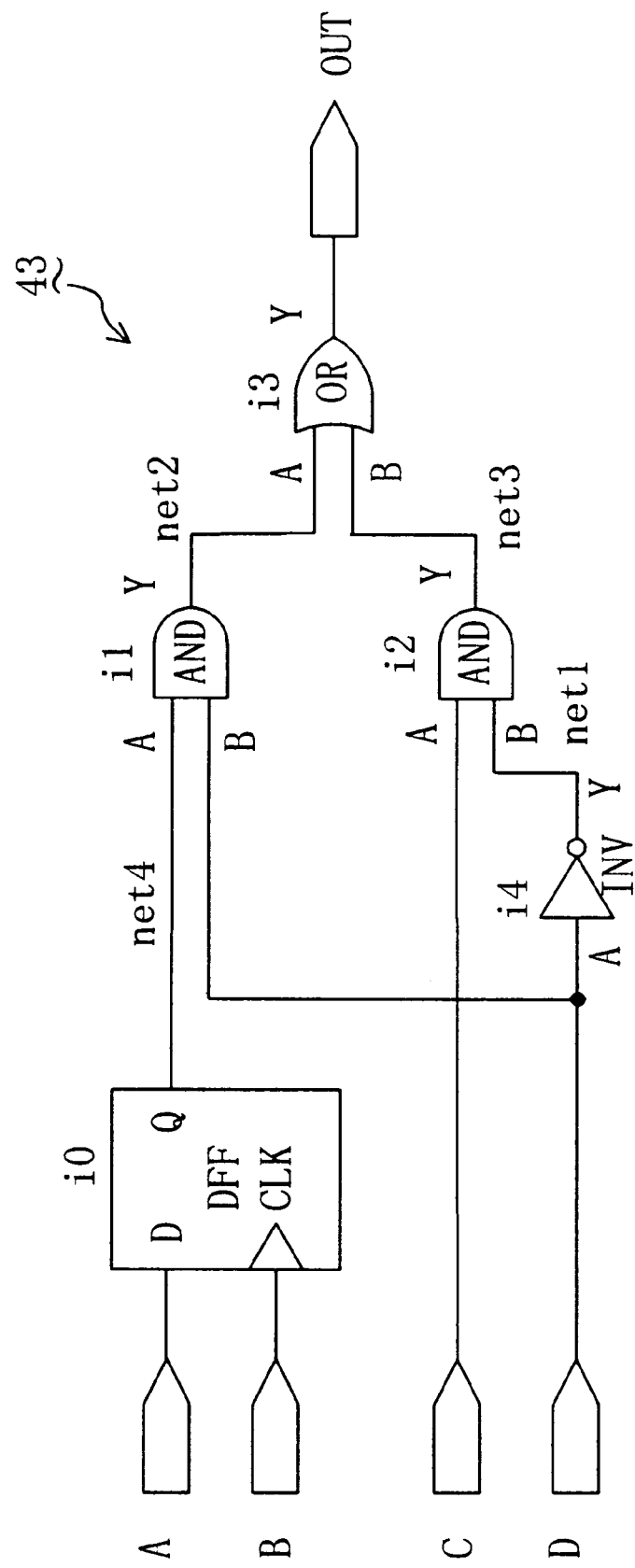
FIG. 8 shows in block form logic circuits in the MT-CMOS integrated circuit belonging to the third embodiment of the invention.

FIG. 8 is a circuit diagram in block form showing an example of the organization of logic circuit group 43. Connected between input pins A–D and an output pin OUT are circuit elements including a flip-flop DFF, two AND circuits, an OR circuit, and an inverter INV. FIG. 8 shows identification names for the circuit elements, names for the input pins, a name for the output pin, and names for wire nets.

Figure 9:
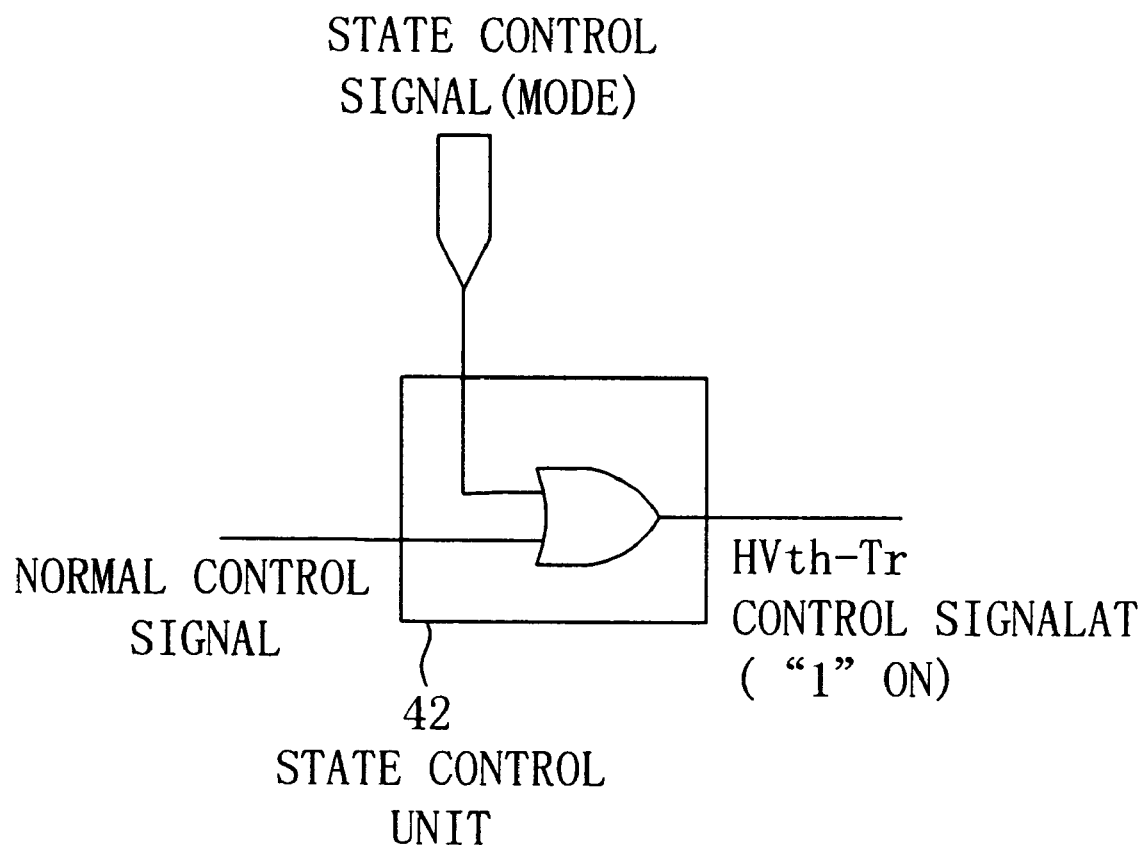
FIG. 9 shows in block form a state control unit of the MT-CMOS integrated circuit belonging to the third embodiment of the invention.

FIG. 9 is a block circuit diagram showing an organization of state control unit 42. State control unit 42 is formed of an OR circuit which receives the normal control signal and the state control signal (MODE) and generates the OR of these input signals. Each HVth-Tr is controlled to go into the ON state when state control unit 42 provides the HVth-Tr control signal at "1". In other words, the function of test control unit 42a and the function of normal control unit 42b (see FIG. 7) are incorporated into the OR circuit.

The functions of test control unit 6a and normal control unit 6b (see FIG. 2) may be implemented by an organization shown in FIG. 9, that is, by a single OR circuit.

A method of generating a test sequence for the above-described semiconductor integrated circuit is illustrated with reference to a flow chart shown in FIG. 10.

In step ST31, a netlist, shown in TABLE 1, is created to be circuit descriptions for logic circuit group 43, a target of testing.

TABLE 1

| module sample1(A,B,C,D,OUT) | |
|---|---|
| input | A,B,C,D; |
| output | OUT; |
| wire | net1,net2,net3,net4; |
| | DFF i0(.D(A),.CLK(B),.Q(net4) |
| AND | i1(.A(net4),.B(D),.Y(net2); |
| AND | i2(.A(C),.B(net1),.Y(net3); |
| OR | i3(.A(net2),.B(net3),.Y(OUT); |
| INV | i4(.A(D),.Y(net1); |

Here, "sample1" is the logic circuit name. "input" indicates the external input pins A–D. "output" indicates the external output pin OUT. "wire" declares that each net1–net4 is a wire net between each cell. "DFF", "AND", "OR", and "INV" are cell names entered in the library, and "i0" to "i4" are instance names for cell identification. "net1" to "net4" each represent a wire net between each cell. For example, a description for "AND" of Table 1 shows that the input pin A, input pin B and output pin Y of the element i1 (an AND element (AND) entered in the library) are connected to the wire net net4, to the external input pin D, and to the wire net net2, respectively.

Circuit descriptions for a semiconductor integrated circuit formed of conventional CMOS integrated circuits, include information about the propagation of signals between each element; however, it does not include information about the supply of electric power to respective elements. The reason is that, since a high-threshold transistor for establishing a disconnection between the power supply and the logic circuit is not provided, the supply of power is a precondition. Also in the present embodiment, if it is assumed that power is supplied to each logic circuit 5a–5x of logic circuit group 43 formed of low-threshold transistors which is a target of testing, logic circuit group 43 can be taken as a conventional CMOS integrated circuit, during the test period. Accordingly, logic circuit group 43 can be described as the foregoing netlist.

In step ST32, a test sequence for the netlist created in step ST31 is generated using the same means as used for conventional CMOS integrated circuits. Table 2 shows a test sequence which is generated by making use of a technique for testing conventional CMOS integrated circuits, assuming the Table 1 circuit description, for detecting the "0" degeneracy failure of the Q output of the flip-flop DFF.

TABLE 2

| A | B | C | D | OUT |
|---|---|---|---|-----|
| 1 | 0 | 0 | 1 | X   |
| 1 | 1 | 0 | 1 | H   |

In Table 1, "0" and "1" each indicate an input signal, "H" indicates that the expected value is "1", and "X" means "don't care".

Next, in step ST33, a test sequence for controlling the state control unit is added to the test sequence of Table 2 generated in step ST32. Table 3 shows a test sequence resulting from adding to the Table 2 test sequence a new sequence about the state control signal MODE.

TABLE 3

| A | B | C | D | OUT | MODE |
|---|---|---|---|-----|------|
| 1 | 0 | 0 | 1 | X   | 1    |
| 1 | 1 | 0 | 1 | H   | 1    |

Referring to Table 3, a signal is provided which controls each HVth-Tr to go into the ON state when the state control signal MODE is at "1". Logic circuit group 43 is tested. More specifically, in this case, the Q output of the flip-flop DFF is tested for the presence or absence of a degeneracy failure.

In this way, a test sequence for MT-CMOS integrated circuits can be generated by making use of a conventional method.

Figure 11:
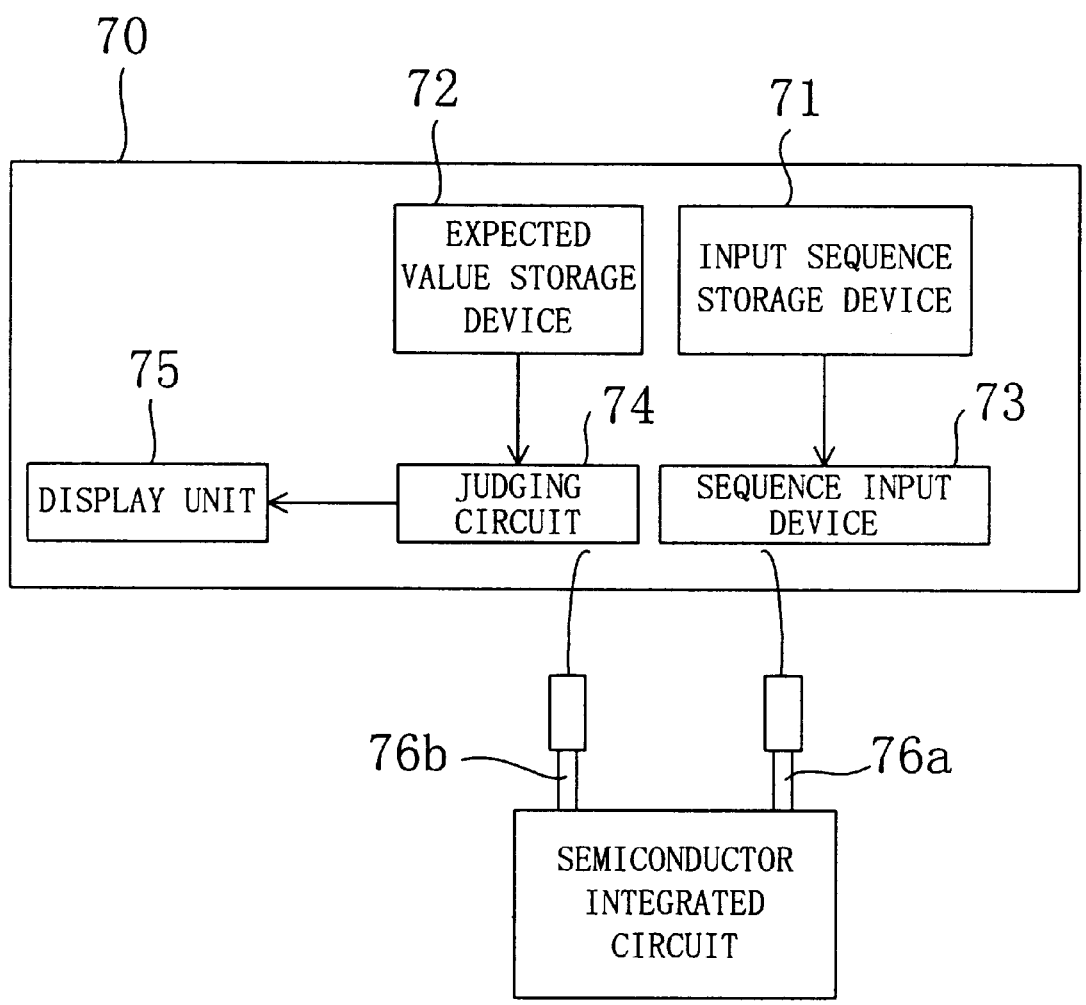
FIG. 11 outlines in block form a test device belonging to the third embodiment of the invention.

FIG. 11 is a block diagram which outlines the organization of a test device for testing logic circuit group 43. Tester 70 has input sequence storage device 71 for storing an input sequence, and expected value storage device 72 for storing an expected value corresponding to the input sequence. With sequence input device 73, signals are applied, via probe 76a on the input side, at external input pins A, B, C, D (see FIG. 8) of logic circuit 43 of the semiconductor integrated circuit device by a sequence (for example, the Table 3 sequence) conforming to the contents of storage in input sequence storage device 71. Further, judging circuit 75 makes a comparison between the logic value of an output signal provided from the external output pin OUT via probe 76b on the output side and the expected value (logic value) stored in the expected value storage device 72. If these values agree, judging circuit 75 makes a judgement of acceptance. On the other hand, if they disagree, judging circuit 75 makes a judgement of rejection. The judgement result is displayed by displaying device 75.

The present embodiment has been described in terms of an MT-CMOS integrated circuit including a plurality of logic blocks formed of MT-CMOS integrated circuits. The invention may be embodied in an MT-CMOS integrated circuit including a single logic block formed of MT-CMOS integrated circuits.

Further, in accordance with the present embodiment, the state control unit is arranged outside the logic blocks. The state control unit may be arranged in each logic block. In such a case, the same effects are obtained.

Further, in accordance with the present embodiment, the state control signal is applied to the state control unit from outside the semiconductor integrated circuit. An organization for generating state control signals within an internal logic circuit can provide the same effects if a sequence which sets a test-target logic circuit group to go into the operation state is added in step ST33.

EXAMPLE 4

Figure 12:
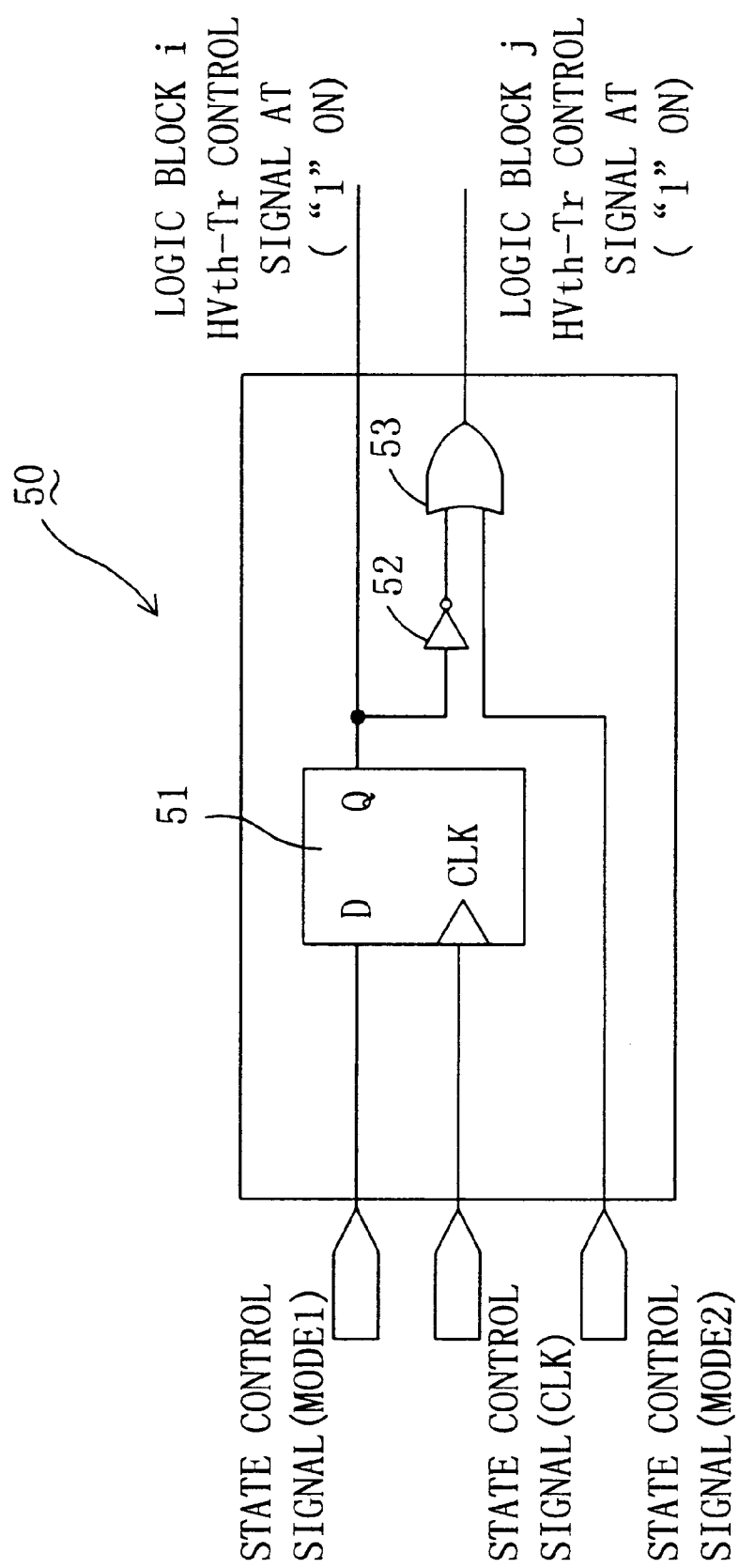
FIG. 12 shows in block form a state control unit in an MT-CMOS integrated circuit belonging to the fourth embodiment of the invention.

A fourth embodiment of the invention is described. The present embodiment relates to a case in which the state control unit is formed of a sequential circuit and provides a plurality of output signals. FIG. 12 is a logic circuit diagram showing the organization of state control unit 50 in accordance with the present embodiment. This state control unit 50 may be applicable to, for example, the FIG. 5 MT-CMOS integrated circuit, in other words state control unit 50 finds applications in cases where a control signal is fed to HVth-Tr's of each logic block. However, for the sake of simplification, it is assumed in the present embodiment that logic circuit group 43 of FIG. 8 is placed in logic blocks i and j.

As shown in FIG. 12, state control unit 50 has flip-flop 51, inverter 52, and OR circuit 53. The Q output from flip-flop 51 is controlled to be at "1" using the state control signal MODE1 and the clock signal CLK, as a result of which the HVth-Tr control signal with respect to logic block i becomes "1" and the output from inverter 52 becomes "0". When the state control signal MODE2 becomes "0", the output from OR circuit 53 becomes "1". In this way, all the HVth-Tr's of logic blocks i and j in which the logic circuit group is arranged, are controlled to go into the ON state. It is arranged such that the normal control signal is applied, not through elements (flip-flop 51, inverter 52 and OR circuit 53) but through state control unit 50, to logic circuit group 43.

Table 4 shows a test sequence for the present MT-CMOS integrated circuit.

TABLE 4

| A | B | C | D | OUT | MODE1 | MODE2 | CLK |
|---|---|---|---|-----|-------|-------|-----|
| x | x | x | x | x   | 1     | x     | 0   |
| x | x | x | x | x   | 1     | x     | 1   |
| 1 | 0 | 0 | 1 | x   | x     | 1     | 0   |
| 1 | 1 | 0 | 1 | H   | x     | 1     | 0   |

Figure 10:
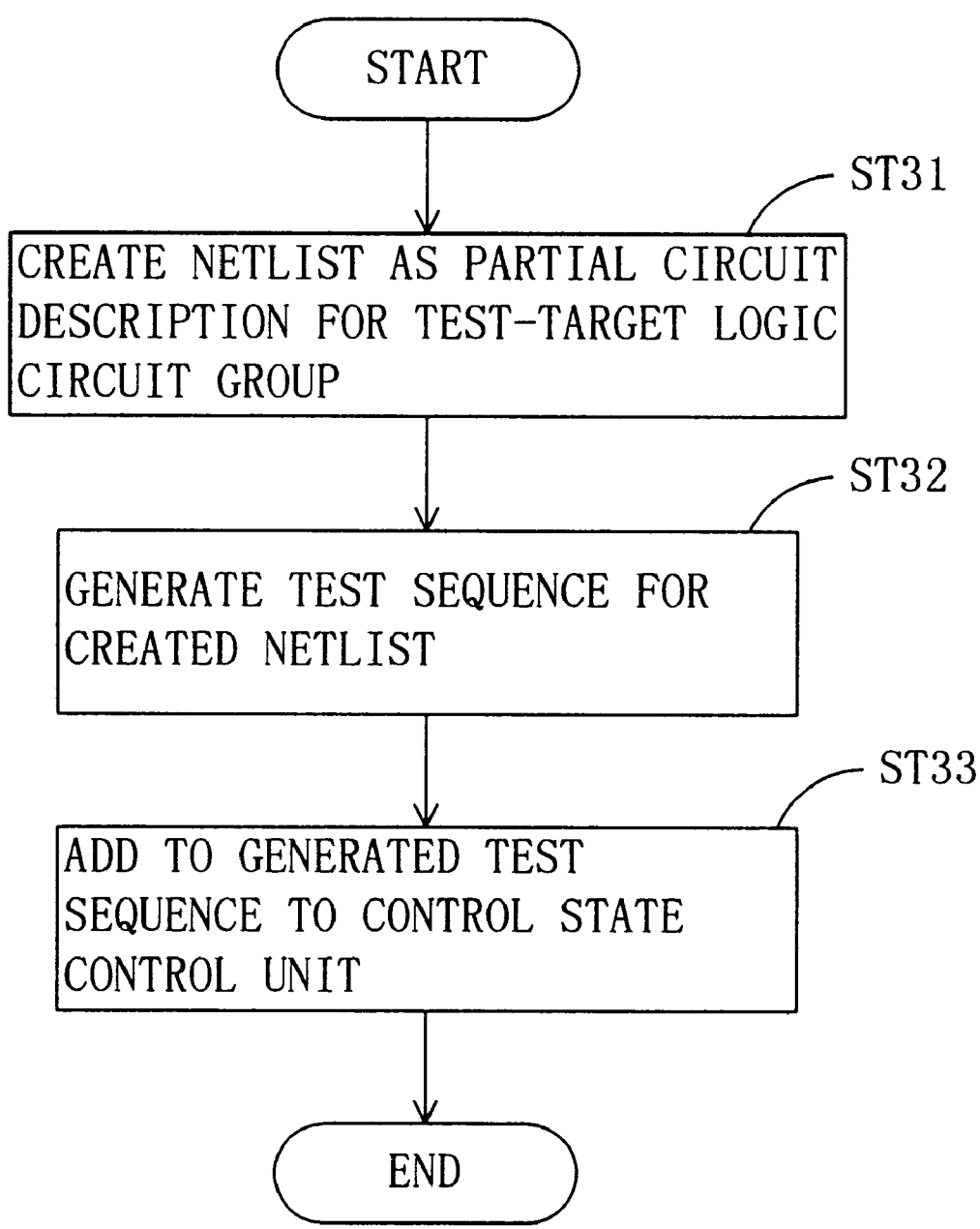
FIG. 10 is a flow chart showing a test procedure belonging to the third embodiment of the invention.

In the same procedure as shown by the FIG. 10 flow chart of the third embodiment, a netlist is created (step ST31) and a test sequence for the created netlist is generated (step ST32). The test sequence generated by a conventional technique is a portion from "A" up to "OUT" of the lower two rows of Table 4 (see Table 1). In step ST33, sequences of MODE1, MODE2 and CLK are added thereby making it possible to control all the HVth-Tr's of the logic blocks, in which the logic circuit group is arranged, to turn on, and the operation of the logic circuit group can be tested. Tester 70 of FIG. 11 may be employed as a test device.

Even in cases where the state control unit is formed of a sequential circuit and the state control unit provides a plurality of output signals, a conventional technique can be used by the provision of a state in the state control unit for obtaining output capable of supplying power to all logic blocks in which a target logic circuit group is arranged.

In the present embodiment, each logic block i and j is a single logic block. However, the present test sequence generation method can be embodied in an organization in which the HVth-Tr control signal is provided to each logic block group formed of a plurality of logic blocks.

Further, in accordance with the present embodiment, the state control unit is arranged outside the logic blocks. The state control unit may be arranged in each logic block. This provides the same effects.

Further, in accordance with the present embodiment, the state control signal is applied to the state control unit from outside the semiconductor integrated circuit. An organization of generating the state control signal in an internal logic circuit can provide the same effects by adding a sequence which sets a logic circuit group, a target of testing, to go into the operation state.

EXAMPLE 5

Figure 13:
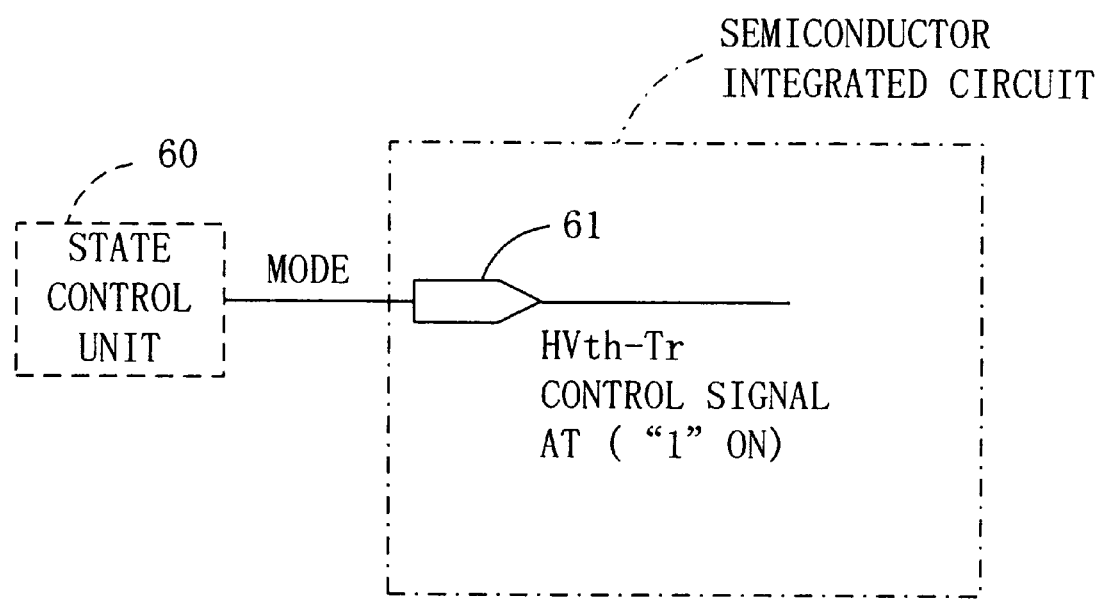
FIG. 13 shows in block form a state control unit in an MT-CMOS integrated circuit belonging to the fifth embodiment of the invention.

A fifth embodiment of the invention is now described in which the state control unit is not placed in the semiconductor integrated circuit and the HVth-Tr control signal is fed directly from outside the circuit. FIG. 13 is a block diagram showing a state control unit and a signal input unit in the semiconductor integrated circuit according to the fifth embodiment.

Referring to FIG. 13, state control unit 60 of the present embodiment is provided in an external apparatus such as a tester and the semiconductor integrated circuit has only input pin 61, in the present embodiment. The state control signal MODE from state control unit 60 is provided intact from the semiconductor integrated circuit as an HVth-Tr control signal.

Table 5 shows a test sequence of the present embodiment.

TABLE 5

| A | B | C | D | OUT | MODE |
|---|---|---|---|-----|------|
| 1 | 0 | 0 | 1 | X   | 1    |
| 1 | 1 | 0 | 1 | H   | 1    |

Table 5 shows that the test sequence is generated in the same procedure as in the third embodiment (see FIG. 10). Also in the present embodiment, tester 70 shown in FIG. 11 may be employed.

Even in cases where the state control unit contains therein no logic elements and the state control signal is applied from the outside, a test sequence for the MT-CMOS integrated circuit can be generated by adding the state control signal MODE for controlling HVth-Tr's to a test sequence generated by a conventional method.

The present embodiment has been described in terms of an MT-CMOS integrated circuit including a plurality of logic blocks formed of MT-CMOS integrated circuits. The invention may be embodied in an MT-CMOS integrated circuit including a single logic block formed of MT-CMOS integrated circuits.

Further, the state control unit may be placed outside the semiconductor chip (the semiconductor integrated circuit) in each of the first to fourth embodiments of the invention.

EXAMPLE 6

A sixth embodiment of the invention is described. The present embodiment relates to a method for generating a test sequence for a semiconductor integrated circuit. In the semiconductor integrated circuit, a high-threshold transistor for testing and another high-threshold transistor for normal control are connected between each logic circuit and the power supply terminal and between each logic circuit and the grounding terminal, respectively.

Figure 14:
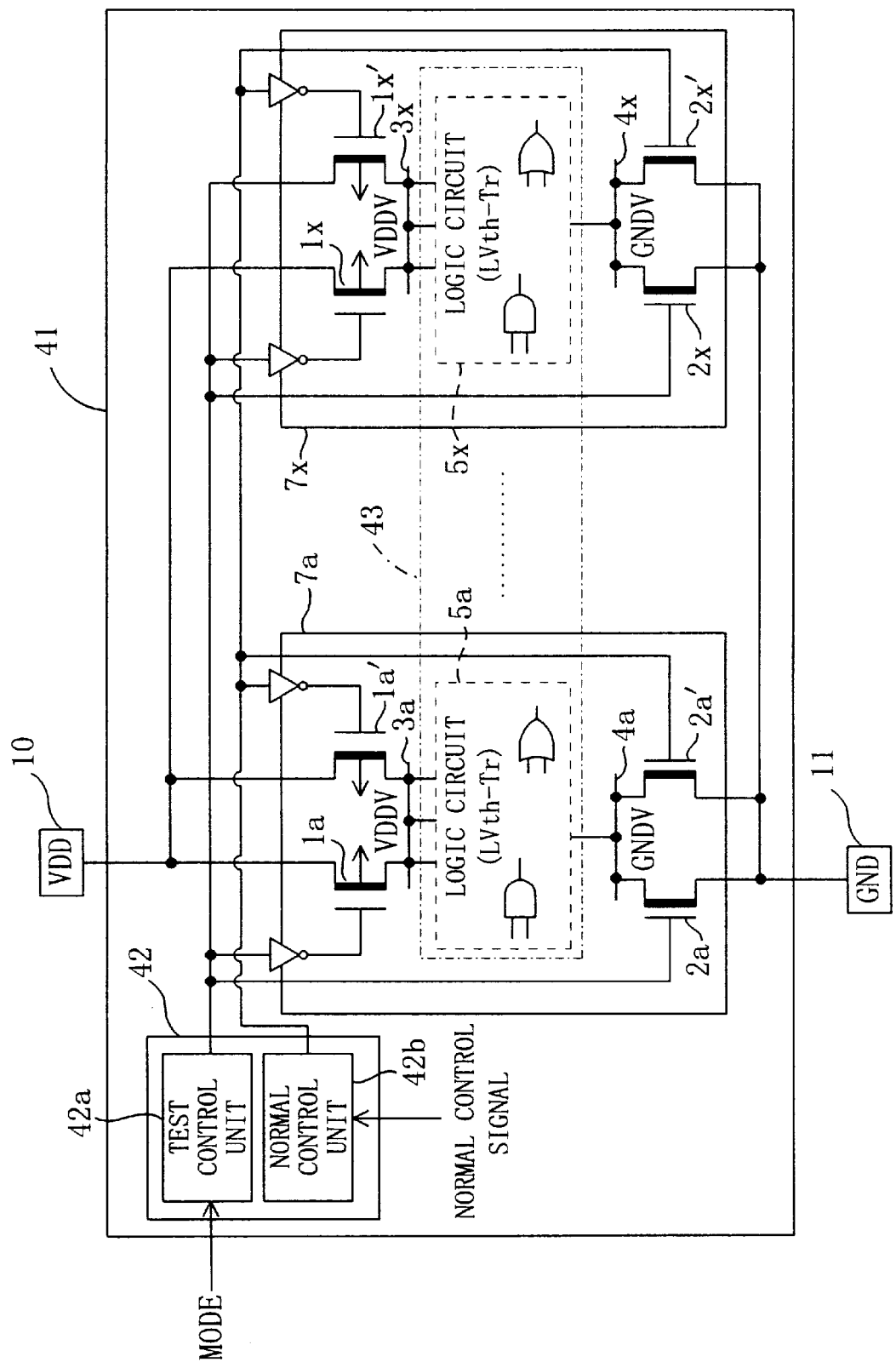
FIG. 14 is an electric circuit diagram of an MT-CMOS integrated circuit belonging to the sixth embodiment of the invention.

FIG. 14 is an electric circuit diagram showing an organization of MT-CMOS integrated circuit 41 of the present embodiment.

As can be seen from FIG. 14, the present semiconductor integrated circuit 41 is basically identical in organization with the third embodiment's semiconductor integrated circuit 41 shown in FIG. 7 except that pHVth-Tr's $1a'-1x'$ and nHVth-Tr's $2a'-2x'$ for normal control are provided for each logic block $7a-7x$ in addition to pHVth-Tr's $1a-1x$ and nHVth-Tr's $2a-2x$ for testing. The pHVth-Tr $(1a-1x)$ and the pHVth-Tr $(1a'-1x')$ are connected in parallel between the virtual power supply terminal $(3a-3x)$ of the logic circuit $(5a-5x)$ and the power supply terminal 10, while on the other hand the nHVth-Tr $(2a-2x)$ and the nHVth-Tr $(2a'-2x')$ are connected in parallel between the virtual grounding terminal $(4a-4x)$ of the logic circuit $(5a-5x)$ and the grounding terminal 11. Test control unit 42a of state control unit 42 controls, based on the test signal MODE, the ON/OFF state of pHVth-Tr's $1a-1x$ and nHVth-Tr's $2a-2x$, while on the other hand normal control unit 42b of state control unit 42 controls, based on the normal signal, the ON/OFF state of pHVth-Tr's $1a'-1x'$ and nHVth-Tr's $2a'-2x'$.

Logic circuit group 43, composed of logic circuits $5a-5x$, may have an organization such as one shown in FIG. 8. It becomes possible to test for a failure occurring in logic circuit group 43 by placing pHVth-Tr's $1a-1x$ and nHVth-Tr's $2a-2x$ into the ON state, and to generate test sequences, as in the third embodiment. Also in the present embodiment, tester 70 shown in FIG. 11 may be employed.

The present embodiment is able to achieve the same effects that the third embodiment does. Also in each of the third to fifth embodiments, HVth-Tr's for testing and HVth-Tr's for normal control may be provided in parallel between the power supply terminal (the grounding terminal) and each logic circuit.

EXAMPLE 7

Figure 15:
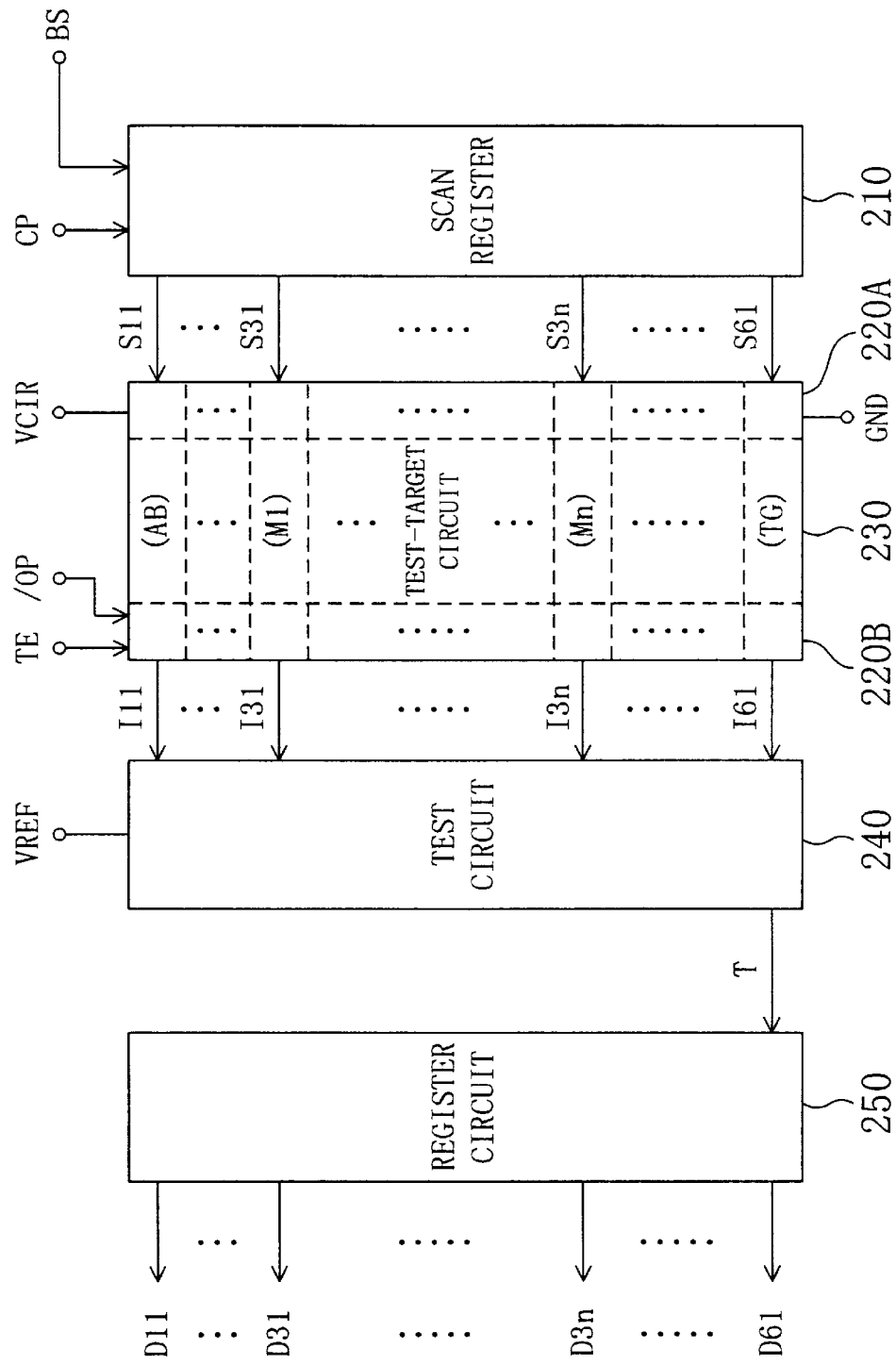
FIG. 15 shows in block form a semiconductor integrated circuit belonging to the seventh embodiment of the invention.

A seventh embodiment of the invention is described by reference to FIGS. 15–19. Referring first to FIG. 15, therein shown is an exemplary structure of a semiconductor integrated circuit (SIC) of the seventh embodiment.

210 is a scan register. The scan register 210 is circuit block selection means operable to receive block selection data BS and to sequentially transfer the received data BS according to a clock CP to provide respective block selection signals S11–S61. 220A and 220B are circuit block switch parts. The circuit block switch parts 220A and 220B are circuit block switch means for (a) applying a circuit voltage VCIR to a test-target circuit 230 as a target for testing constructed of circuit blocks including a circuit block AB and a circuit block TG and (b) switching the paths of circuit currents flowing in the circuit blocks between the paths of detected currents I11–I61 and a path to ground (GND) in response to the test enable signal TE, the block selection signals S11–S61, and the operation selection signal /OP ("/" is indicative of a signal of negative logic). The test-target circuit 230 may comprise SRAMs, ROMs, and logical circuits formed on the same chip. The test-target circuit 230 is a circuit divisible into a plurality of circuit blocks, i.e., the foregoing circuit blocks AB–TG. 240 is a test circuit. The test circuit 240 is test means for cutting off the paths of each detected current I11–I61 during the normal mode of operation, for generating a reference current on the basis of a reference voltage VREF received, for making a comparison between a detected current received and the reference current generated, and for providing a block test result T when a specified condition is met. 250 is a register circuit. The register circuit 250 is storage means for receiving the block test result T and sequentially shifting the block test result T to generate parallel block test data D11–D61, and for providing the test data D as required, for example, when it is required to specify a faulty circuit block.

The operation of the FIG. 15 SIC is now described below. The scan register 210 sequentially transfer the block selection data BS composed of a string of bits such as [HIGH LOW LOW LOW LOW, . . . ] of which a bit in the MSB position is the only one HIGH bit, and sequentially places one of the block select signals S11–S61 in the state of HIGH for forwarding to the circuit block switch parts 220A and 220B according to the clock CP. Upon the receipt of the test enable signal TE at the level of HIGH, the circuit block switch parts 220A and 220B switch the paths of the circuit currents in the circuit blocks AB–TG. More specifically, the switch parts 220A and 220B supply to the test circuit 240 a detected current I corresponding to a circuit block that receives a block selection signal S at HIGH (for example, if the signal S11 is HIGH, then the detected current I11 is supplied to the circuit 240). On the other hand, upon the receipt of the test enable signal TE at the level of LOW, all of the circuit currents I11–I61 in the test-target circuit 230 are supplied to the test circuit 240 when the operation selection signal /OP is HIGH. When the operation selection signal /OP is LOW, all of the circuit currents I11–I61 flow out of the circuit 230 to ground (GND). During the test mode of operation of a certain circuit block, the test circuit 240 prepares, based on the received reference voltage VREF, a reference current as a reference value and provides the block test result T indicating that the circuit block fails to operate normally when a detected current as to the circuit block exceeds the value of the reference current. Additionally, during the normal mode of operation, the paths of the circuit (detected) currents are placed in the cutoff state. The register circuit 250 receives and sequentially shifts the result T to generate the block test data D11–D61 indicating which of the circuit blocks fails to operate normally. The register circuit 250 provides the block test data D11–D61 as required. The above-described operation makes it possible to examine either a circuit current flowing in a circuit block selected from among all the circuit blocks AB–TG or a plurality of circuit currents flowing in a plurality of circuit blocks selected from among all the circuit blocks AB–TG.

Figure 16:
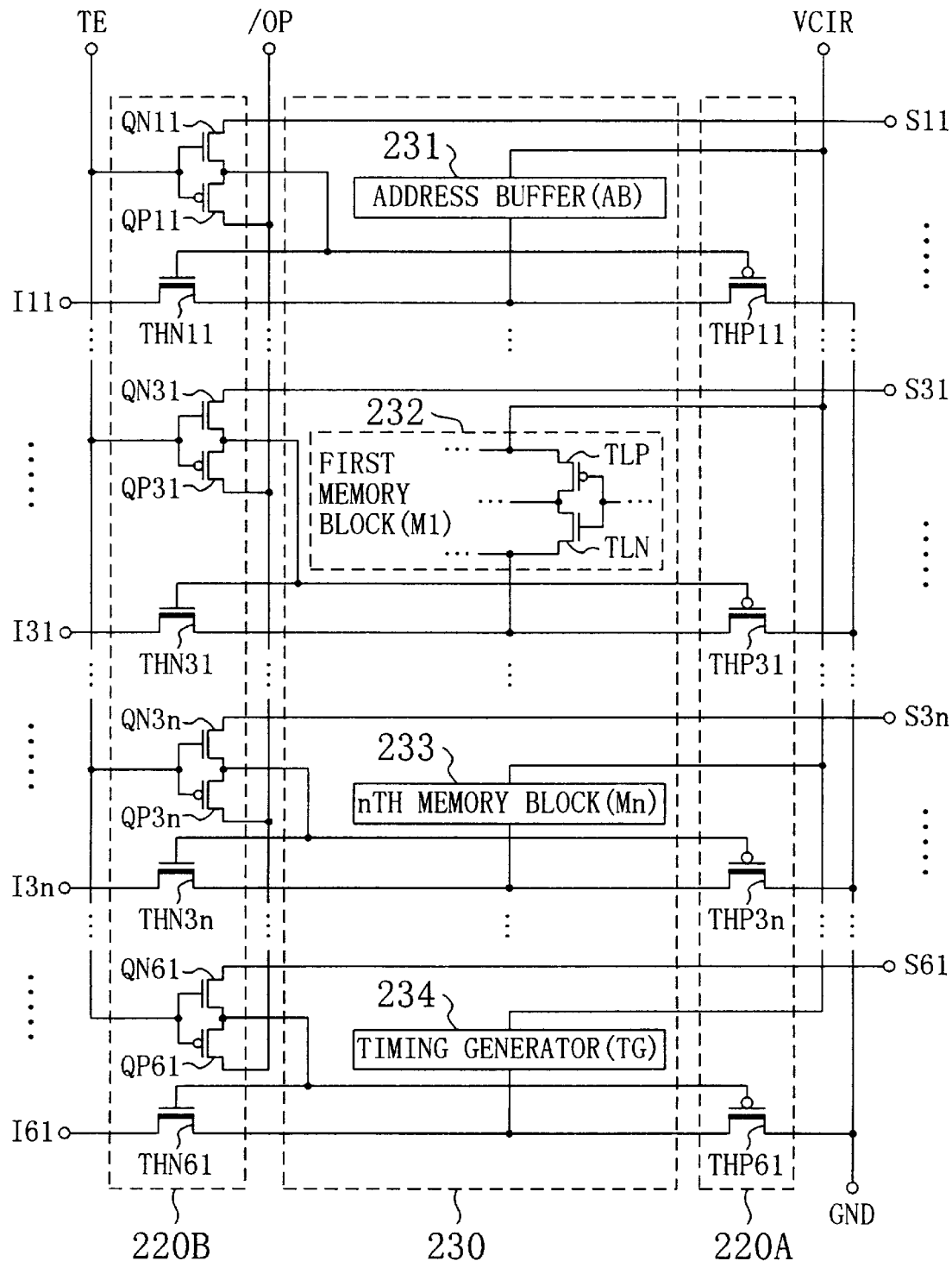
FIG. 16 is a circuit diagram showing the details of a test-target circuit, i.e., a candidate for testing, and a circuit block switch part shown in FIG. 15.

FIG. 16 shows the test-target circuit 230 and the circuit block switch parts 220A and 220B in FIG. 15. The test-target circuit 230 is constructed of circuit blocks including an address buffer 231, first through nth memory blocks 232–233 and a timing generator 234. The circuit voltage VCIR is applied to each of these circuit blocks. Each circuit block is provided with a current path through which its circuit current is discharged to GND during the normal mode of operation, and another current path into which its circuit current as a detected current I is discharged during the test mode of operation. Each circuit block is a CMOS integrated circuit constructed of a low-Vth NMOS and a low-Vth PMOS transistor TLN and TLP. High-Vth PMOS transistors THP11–THP61 together form the circuit block switch part 220A. Each high-Vth PMOS transistor THP11–THP61 acts as a power supply line switch means capable of cutting off a respective current path (i.e., a respective normal mode operation current path) to GND. On the other hand, each high-Vth NMOS transistor THN11–THN61 acts as a power supply line switch means capable of cutting off a respective current path (i.e., a respective test mode operation current path) to the test circuit 240. Low-Vth NMOS transistors QN11–QN61 and low-Vth PMOS transistor QP11–QP61 are drive devices for the switching of the high-Vth MOS transistors and form, together with the high-Vth NMOS transistors THN11–THN61, the circuit block switch part 220B.

The operation of the circuit block switch part 220A and the operation of the circuit block switch part 220B are described in different situations. In the first situation, the test enable signal TE is HIGH. In this case, all the low-Vth NMOS transistors QN11–QN61 turn on and, at the same time, all the low-Vth PMOS transistors QP11–QP61 turn off. As a result, the block selection signals S11–S61 are supplied to the gates of the high-Vth MOS transistors in the circuit blocks, wherein a circuit block that has received a block selection signal S at HIGH is selected. In such a selected circuit block, its high-Vth NMOS and PMOS transistors THN and THP are placed in the ON state and in the OFF respectively. Because of this, the selected circuit block is connected to its test mode operation current path while it is cut off from its normal mode operation current path. A circuit current in the selected circuit block becomes a corresponding detected current I which is then supplied through the test mode operation current path to the test circuit 240. At this time, circuit currents in the remaining other circuit blocks that have received block selection signals S at LOW are discharged to ground (GND) and these circuit blocks therefore have no effect on testing.

On the other hand, when the test enable signal TE is LOW, all the low-Vth NMOS transistor QN11–QN61 turn off and, at the same time, the all the low-Vth PMOS transistors QP11–QP61 turn on. As a result, the operation selection signal /OP is supplied to the gates of the high-Vth MOS transistors. In the second situation, SIGNAL TE is LOW and SIGNAL /OP is HIGH. In this case, all the high-Vth NMOS transistors THN11–THN61 turn on and, at the same time, all the high-Vth PMOS transistors THP11–THP61 turn off. As a result, all of the circuit blocks are connected to their respective test mode operation current paths and are cut off from their respective normal mode operation current paths. Accordingly, the detected currents I11–I61, i.e., the circuit currents of all of the circuit blocks, are supplied by way of the test mode operation current paths to the test circuit 240. These current paths are cut off separately at their respective supply destination and the overall circuit current in the test-target circuit 230, i.e., the amount of current consumed in the test-target circuit 230, becomes zero. In the third situation, SIGNAL TE is LOW and SIGNAL /OP is LOW. In this case, all the high-Vth NMOS transistors THN11–THN61 turn off and, at the same time, all the high-Vth PMOS transistors THP11–THP61 turn on. As a result, all the circuit blocks are connected to the normal mode operation current paths and are cut off from the test mode operation current paths, and all the circuit currents are discharged to ground thereby permitting normal-mode operations. The first situation's signal combination is used for test mode operations. The second situation's signal combination is used for normal standby mode operations. The third situation's signal combination is used for normal mode operations.

Figure 17:
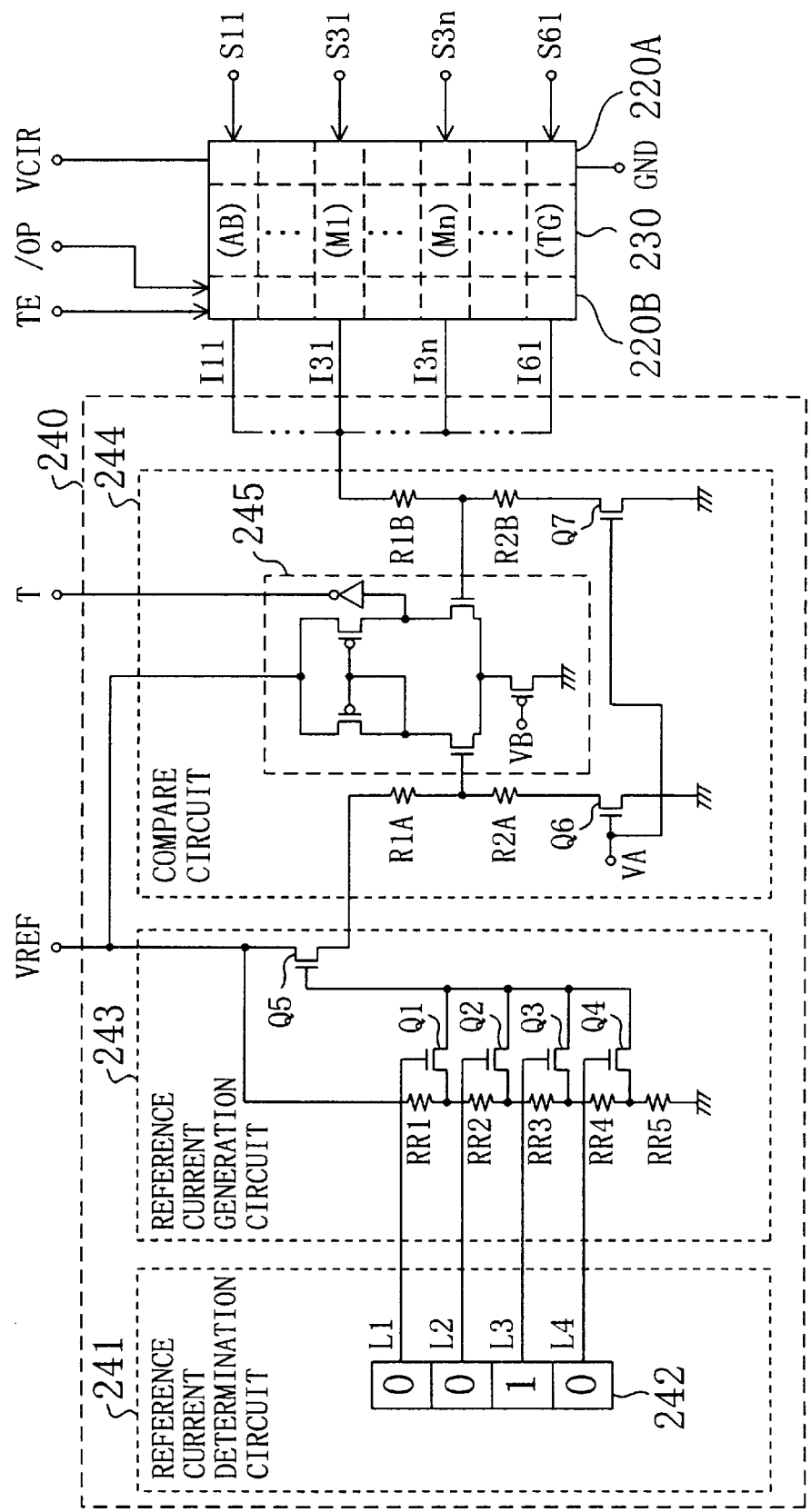
FIG. 17 is a circuit diagram showing the details of a test circuit shown in FIG. 15.

FIG. 17 is a circuit diagram of the test circuit 240 shown in FIG. 15. A reference current determination circuit 241 is a signal supply means for supplying current designation signals L1–L4 on the basis of parallel data of bits in which the number of logical 1 bits is one (in other words, the remaining other bits are all logical 0 bits), to determine a reference current value. The circuit 241 is formed of a reference current determination memory 242 for storing the parallel data. 243 is a reference current generation circuit. The circuit 243 is a reference value generation means for determining a reference current from the received reference voltage VREF on the basis of the signals L1–L4. The circuit 243 provides the reference current thus determined. 244 is a compare circuit. The compare circuit 244 is a comparison means. The compare circuit 244 cuts off the paths of the detected currents during the normal mode of operation, while on the other hand during the test mode of operation the circuit 244 receives a detected current and a reference current to make a comparison therebetween, and provides the block test result T at HIGH when the detected current exceeds the reference current. The reference current generation circuit 243 is formed of reference current determination resistors RR1–RR5 and MOS transistors Q1–Q5. The compare circuit 244 is formed of voltage division resistors R1A, R2A, R1B, R2B, MOS transistors Q6 and Q7, and a comparator 245. The resistors R1A and R1B have the same resistance. The resistors R2A and R2B have the same resistance. A bias voltage VA is used to adjust the value of current flowing in each MOS transistor Q6 and Q7 and to turn off both the MOS transistors Q6 and Q7 during the normal mode of operation. On the other hand, a bias voltage VB is used to adjust the value of current flowing in the comparator 245 and to turn off the comparator 245 during the normal mode of operation.

The operation of the test circuit 240 is described. The test circuit 240 is fed the reference voltage VREF as a power supply voltage only during the test mode of operation to operate. Since in normal mode operation VREF is not applied to the test circuit 240 and all of the MOS transistors Q6 and Q7 and the comparator 245 are placed in the OFF state, the paths of the detected currents I11–I61 are cut off from the test-target circuit 230. As a result, the overall circuit current in the test-target circuit 230, i.e., the amount of current consumed in the circuit 230, becomes zero during the normal standby mode of operation. On the other hand, during the test mode of operation, the standard supply voltage (Vdd) of the test-target circuit 230 is applied as VREF to the test circuit 240 and is also applied as VCIR to the test-target circuit 230. The reference current determination circuit 241 supplies, based on the parallel data of four bits stored in the memory 242, the signals L1–L4 of which the signal L3 is HIGH. The signal L3 at HIGH causes its corresponding MOS transistor Q3 to turn on to divide VREF by use of a combination of the resistors RR1–RR5 and the resulting voltage is applied to the gate of the MOS transistor Q5. According to the gate voltage received, the MOS transistor Q5 amplifies a current supplied by VREF for forwarding to the compare circuit 244. The compare circuit 244 applies to one input terminal of the comparator 245 a set voltage produced by the amplified current and the resistors R1A and R2A and applies to the second input terminal of the comparator 245 a detected voltage produced by the received detected current and the resistors R1B and R2B. The comparator 245 makes a comparison between the set voltage and the detected voltage applied at its respective input terminals and provides the block test result T at HIGH when the detected voltage is greater than the set voltage. Comparison of a detected voltage and a set voltage makes it possible to compare a detected current and a reference current. Additionally, by supplying Vdd as VREF and by adequately determining VCIR that is supplied to the test-target circuit 230, it becomes possible to facilitate acceleration testing by application of an excessive voltage as VCIR. In this case, in order to achieve external application of VCIR and VREF from outside the semiconductor integrated circuit during the test mode of operation, terminals for these voltages may be provided on the semiconductor integrated circuit.

In the foregoing description, the circuit 243 generates reference currents of four different values on the basis of four different voltages obtained by voltage division of VREF. The number of levels of voltage produced by voltage division of VREF may be increased using the following structure for further division of the reference current value.

For example, an arrangement may be made in which there are provided three reference current determination memories 242. The number of data items is increased up to 12, with four data items stored in each memory 242. The number of combinations of the resistors RR1–RR4 and the MOS transistors Q1–Q4 is increased to 12. As a result, each data item is assigned a respective combination of a resistor RR and a MOS transistor Q. Here, to determine a reference current at crude accuracy, (i) the resistance of each of a first group of four resistors RR1–RR4 is set in order that voltage division by these resistors RR1–RR4 may be carried out in a wide voltage range, (ii) the resistance of each of a second group of four resistors RR1–RR4 is set in order that voltage division by these resistors RR1–RR4 may be carried out in a medium voltage range, and (iii) the resistance of each of a third group of four resistors RR1–RR4 is set in order that voltage division by these resistors RR1–RR4 may be carried out in a narrow voltage range. In other words, these three register groups function as a low accuracy resistor group, as a medium accuracy resistor group, and as a high accuracy resistor group, respectively. Likewise, the twelve data items in the memories 242 are supplied to their corresponding MOS transistors as low accuracy data, as medium accuracy data, and high accuracy data, respectively. As a result, the twelve MOS transistors are placed either in the ON state or in the OFF state based on the 12-bit data read out of the memories 242. Accordingly, resistors of the three resistor groups selected by the corresponding MOS transistors and the resistor RR5 are connected in series and VREF is voltage-divided by the these resistors in series connection. In this way, a voltage resulting from voltage division of VREF, i.e., a voltage able to be highly accurate, is applied to the gate of the MOS transistor Q5 thereby allowing a reference current to take a further divided fine value. If it is judged from characteristics of a test-target circuit and from required accuracy that testing at crude accuracy is sufficient, then only the four low accuracy resistors are used to obtain a reference current. On the other hand, if high-accuracy testing is required, then all of the low, medium, and high accuracy resistor groups are used to obtain a reference current. Testing is carried out based on the obtained reference current. Being compared in value with such an obtained reference current, each of the detected currents I11–I61 is judged by the compare circuit 244.

The aspect of the above-described structure is to provide semiconductor integrated circuits capable of being tested quickly when testing may be carried out at low accuracy because only the four low accuracy resistors are involved and also capable of being tested at high accuracy as required.

In the present embodiment, the number of reference current determination memories 242 each capable of storage of four bits is three, which allows one reference current to assume twelve different values. However, the number of reference current determination memories is not limited to three and the number of bits that each memory is designed to store is not limited to four.

Figure 18:
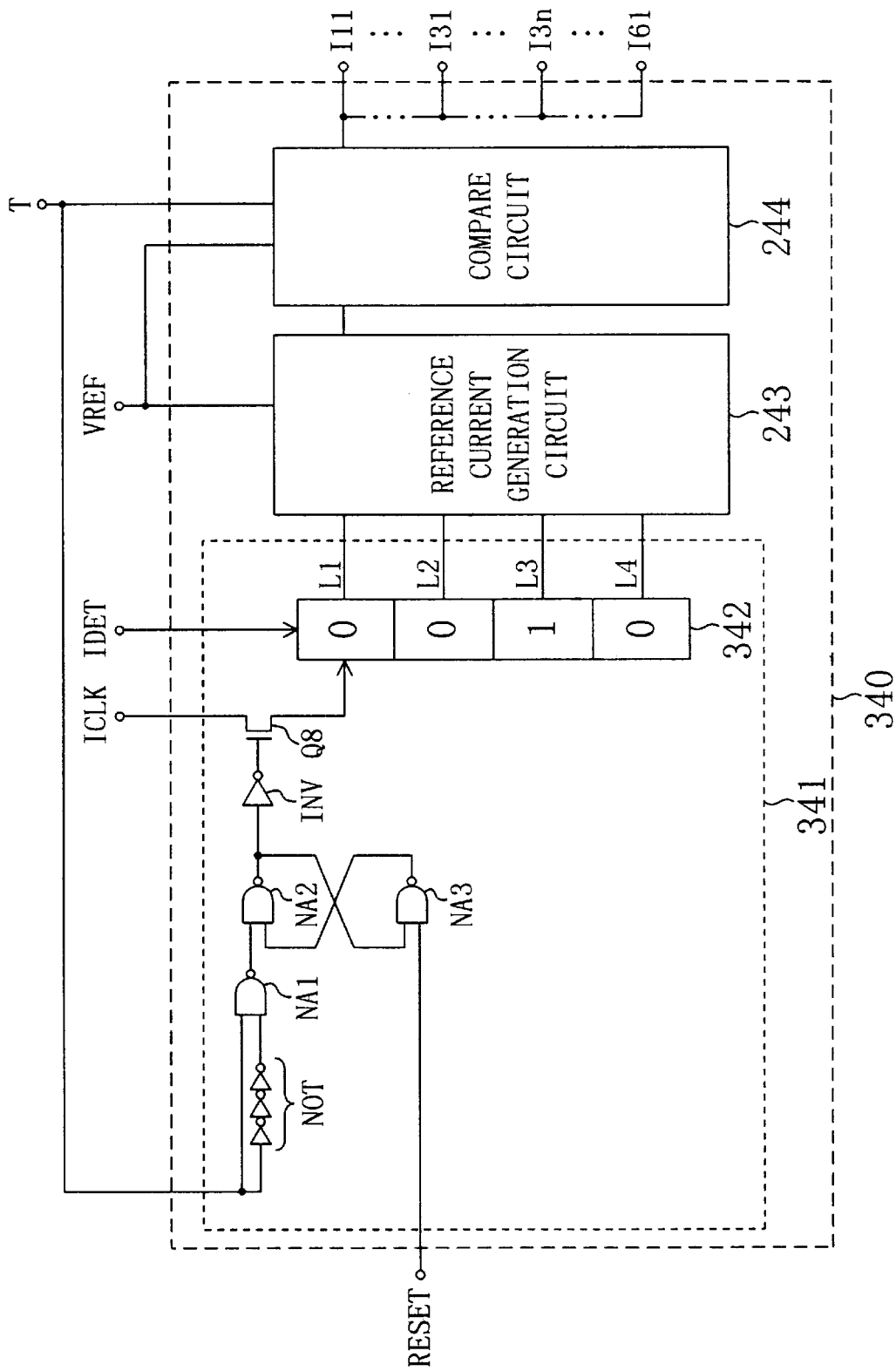
FIG. 18 is a circuit diagram of a circuit where a reference current value is determined based on measured values.

As describe above, reference currents are determined by input values to the reference current determination memory 242. Referring now to FIGS. 17 and 18, as a modified version of the reference current determination technique of the present embodiment a reference current determination structure on the basis of an actually measured leakage current value is now described below.

FIG. 18 is a circuit diagram of a circuit for use in determining a reference current value based on a measured leakage current value. In the following description the same elements as shown in FIG. 17 have been indicated by like reference numerals and the description thereof is not made.

A test circuit 340 of FIG. 18 results from addition of a structure for sequentially increasing the value of reference current, to the test circuit 240 of FIG. 17. A reference current determination circuit 341 is a signal supply means for providing the current designation signals L1–L4 on the basis of parallel data composed of bits in which the number of logical 1 bits is only one (in other words, all the remaining other bits are logical 0 bits), to determine a current reference value. The circuit 341 is constructed of an inverting circuit NOT of three inverters, an inverter INV, NAND circuits NA1–NA3, an NMOS transistor Q8, and a reference current determination memory 342. The memory 342 is a storage means for storing bits that are all at logical 0 at the start of operation of the circuit 341. With the operation of the circuit 341, the memory 342 acts as a shift register and generates and stores parallel data. A current determination clock ICLK, which is applied through the NMOS transistor Q8 to the memory 342, is a clock for allowing the memory 342 to perform sequential shift operation. A reference current determination signal IDET, which is applied to the memory 342, is a signal composed of a string of bits of which a bit in the MSB position is the only one HIGH bit (that is, all the remaining other bits are LOW). RESET indicates a reset signal, and the LOW state of the signal RESET at the time when the clock ICLK is not supplied to the memory 342 starts a supply of the clock ICLK to the memory 342.

The operation of the reference current determination circuit 341 is described. A reference circuit block is preselected which is the circuit block that is estimated, when viewed in the light of circuit configuration, to be most likely to undergo the occurrence of leakage current and a leakage current that flows in the reference circuit block is measured. A circuit current flowing in the reference circuit block as the test-target circuit 230 is supplied by the circuit block switch parts 220A and 220B of FIG. 17 to the compare circuit 244 via a test mode operation current path. The compare circuit 244 compares the circuit current as a detected current I and a reference current, and provides the block test result T at HIGH when the detected current exceeds the reference current.

As the signal IDET of FIG. 18, a serial signal [HIGH LOW LOW LOW . . . , LOW] is sequentially supplied according to CLOCK ICLK, on the basis of current determination data [1 0 0 0 . . . 0] of a string of bits of which a bit in the MSB position is the only one logical 1 bit and all the remaining other bits are logical 0 bits. As the signal RESET, a LOW is supplied only at the start of the operation of the circuit 341, and in the other situations a HIGH is supplied. In other words, at the operation start of the circuit 341 the signal RESET is LOW, so that the output of the NAND circuit NA3, i.e., one input of the NAND circuit NA2, is fixed at HIGH.

A situation, in which the block test result T is LOW, i.e., a situation in which a detected current from the reference circuit block falls below the reference current, is considered. In such a case, since the result T is supplied to one input of the NAND circuit NA1 and a signal which is an inversion of the result T is supplied to the second input of the NAND circuit NA1, the output of the NAND circuit NA1 as the second input of the NAND circuit NA2 is HIGH, regardless of the result T. Since all of the inputs of the NAND circuit NA2 are HIGH, the output of the NAND circuit NA2 is therefore LOW. The inverter INV provides a HIGH as its output, which turns on the NMOS transistor Q8. The clock ICLK is then applied to the memory 342. In the memory 342, the signal IDET is sequentially shifted according to the clock ICLK.

Next, a situation, in which a HIGH of the signal IDET on the basis of the MSB of logical 1 of current determination data is sequentially shifted resulting in the block test result T becoming HIGH, is considered, in other words, a situation, in which a detected current exceeds the reference current, is considered. In this case, the block test result T at HIGH is supplied to the one input of the NAND circuit NA1 and, thereafter, the block test result T, which has been delayed and inverted by the inversion circuit NOT from HIGH to LOW, is supplied to the second input of the NAND circuit NA1. In other words, only for a short period of time from the time when the result T is supplied to the one input of the NAND circuit NA1 until the time when the delayed, inverted result T is supplied to the second input of the NAND circuit NA1, both the inputs of the NAND circuit NA1 are fed HIGHs respectively. As a result, only for a short period of time, the circuit NA1 supplies a LOW, as its output, to one input of the NAND circuit NA2. In this case, the NAND circuit NA2 supplies a HIGH as its output, regardless of the level of signals received from the NAND circuit NA3. Because of this, the output of the inverter INV is LOW and the NMOS transistor Q8 therefore turns off. The supply of the clock ICLK to the memory 342 comes to a halt. Accordingly, in the memory 342 the signal IDET, which has been shifted sequentially, becomes fixed. In other words, data descriptive of the detected current from the reference block in this case is held in the form of parallel data in the memory 342. Thereafter, if the value of the detected current falls below the value indicating a fatal defect such as a short due to bridging between wires, the parallel data are then supplied as SIGNALS L1–L4 to the circuit 243. Such arrangement makes it possible to use the value of the detected current from the reference block as a leakage current reference value.

A LOW may be provided as SIGNAL RESET at the time of again making a comparison between detected current and reference current. This again places the memory 342 in the operation start state and the supply of the clock ICLK can be started.

In accordance with the present modified version, a leakage current flowing in a circuit block that is estimated, when viewed in the light of circuit configuration, to be most likely to undergo the occurrence of leakage current, is really measured, and a leakage current flowing in a different circuit block is judged using such a measured value as a reference value. The use of such an actually-measured value makes it possible to perform tests without adopting an excessively severe reference value even when there is a change in the value of leakage current due to, for example, process fluctuation. The present modified version of the invention provides semiconductor integrated circuits that can be fabricated at stable yield rate.

The present modified version may be applied to a specified circuit block that is estimated, when viewed in the light of circuit configuration, to be highly susceptible to be influenced by leakage current. In such a case, if such a circuit block is judged to operate normally, it is possible to assume that the remaining other circuits also operate normally. This provides semiconductor integrated circuits that can be tested involving a less number of test steps.

As a candidate for measurement, that is, as a reference circuit block, either a circuit block on the same chip or a circuit block on a different chip may be used. For example, if a specific chip formed near a periphery of a wafer is estimated to be most likely to undergo the occurrence of leakage current, a circuit block formed in such a chip may be used as a reference circuit block.

Particularly, if one of circuit blocks in a different chip with the same structure as a test-target circuit block is selected as a reference circuit block, this makes it possible to more accurately perform testing because they are nearly identical in leakage current value with each other.

Additionally, as a reference circuit block, a circuit block lying adjacent to a test-target circuit block may be used. In other words, a circuit block that is considered to have been fabricated in fabrication conditions most similar to the fabrication conditions of a test-target circuit block, is used as a reference circuit block. This provides a semiconductor integrated circuit made up of circuit blocks having a more uniform leakage current distribution. Such arrangement is effective in, for example, fabricating semiconductor integrated circuits in ranks. Additionally, testing configuration can be simplified because a leakage current flowing in a test-target circuit block and another flowing in an adjacent circuit block are always compared with each other.

If a circuit block with a different configuration from a test-target circuit block is used, this may produce the problem that there occurs a difference in the value of leakage current between these two circuit blocks due to the configuration difference. In this case, arrangement may be made to perform a test by a threshold shift by the compare circuit 244 of FIG. 17, to prevent a normal leakage current value difference from being judged as fault.

In accordance with the present modified version of the invention, the supply of the clock ICLK to the memory 342 is cut off when the block test result T enters the HIGH state. The same arrangement may be applied to testing such as an IDDQ test. In other words, the FIG. 18 circuit structure may be used even when a fault is detected in the course of an IDDQ test on the FIG. 15 semiconductor integrated circuit. In this case, at the time when the block test result T enters the HIGH state, i.e., when a detected current from the reference circuit block exceeds the reference current, the shift operation of the scan register 210 is stopped to abort the test. This eliminates the need to take time for testing after a fault is detected, therefore achieving reductions in the overall testing time.

Figure 19:
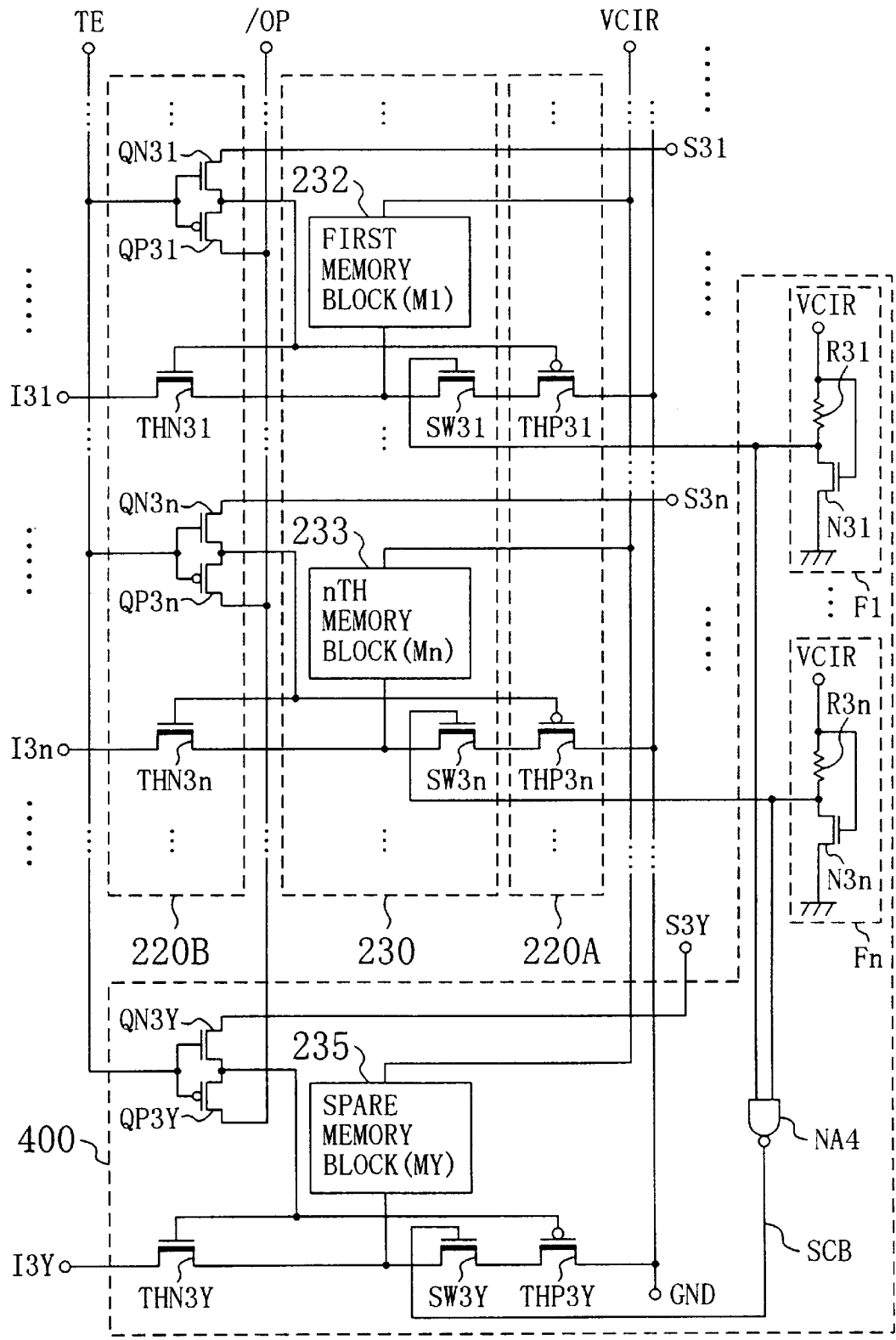
FIG. 19 is a circuit diagram partially showing a circuit formed as a result of addition of a spare block switch circuit to the FIG. 16 circuit.

Referring now to FIG. 19, therein shown is another modified version of the semiconductor integrated circuit of the present embodiment. It is preferred that, even when the above-described test technique discovers that a semiconductor integrated circuit contains therein a faulty circuit block, such a faulty semiconductor integrated circuit can be restored to normal operation as a whole and be used as a product instead of discarding it. In the present modified version, a structure, shown in FIG. 19, is used to provide a semiconductor integrated circuit capable of being restored to normal operation even when it is judged to fail to operate normally. FIG. 19 is a circuit diagram showing a part of a circuit as a result of addition of a spare block switch circuit to the FIG. 16 circuit. In the following description the same elements as shown in FIG. 16 have been indicated by like reference numerals and the description thereof is not made.

A spare block switch circuit 400 of FIG. 19 is a switch means for the switching of a faulty circuit block to a spare circuit block. The circuit 400 has a spare memory block 235, a high-Vth PMOS transistor THP3Y, a high-Vth NMOS transistor THN3Y, a low-Vth NMOS transistor QN3Y, a low-Vth PMOS transistor QP3Y, a switch NMOS transistor SW3Y, fuse means F1–Fn, and a NAND circuit NA4.

The spare memory block 235 is a memory block to replace with a faulty memory block, having the same structure as each of the first to nth memory blocks 232–233 (M1–Mn). The transistors THP3Y and THN3Y are power supply line switch means. Entering the ON state, the transistor THP3Y secures a current path for the operation of the spare memory block 235. Entering the ON state, the transistor THN3Y secures a current path for the test operation of the spare memory block 235. The transistors QN3Y and QP3Y are drive elements for the switching of the transistors THP3Y and THN3Y according to the level of the test enable signal TE.

Each fuse means F (F1–Fn) is a circuit cutoff means made up of a fuse resistor R (R31–R3n) and an NMOS transistor N (N31–N3n). As the NMOS transistors N31–N3n, transistors having a small gate W/L ratio (i.e., high-resistance transistors in which little current flows) are employed. The NAND circuit NA4 is a logical gate for providing, based on the output of each fuse means F1–Fn, a spare block switch signal SCB formed of a NAND logical signal. The transistor SW3Y is a switch means for the opening and closing of a current path for the operation of the spare memory block 235 according to the level of SIGNAL SCB received from the NAND circuit NA4.

Each of the memory blocks M1–Mn, which are identical in structure with the spare memory block 235, is a memory block to electrically replace with the spare block 235 when it is determined as a faulty memory block. Connected between the node of the first memory block 232 and the transistor THN31 and the transistor THP31 is the transistor SW31 with its gate coupled to the output of the fuse means F1. Likewise, connected between the node of the nth memory block 233 and the transistor THN3n and the transistor THP3n is the transistor SW3n with its gate coupled to the output of the fuse means Fn. The remaining other memory blocks are identical in circuit structure with the first and nth memory blocks. The gates of the transistors SW31–SW3n are coupled to the inputs of the NAND circuit NA4 respectively.

Referring to FIG. 19, the memory block replacement operation of the spare block switch circuit 400 is now described below.

First, a situation, in which each memory block M1–Mn operates normally, is considered. In this case, no processing is performed on each fuse resistor R31–R3n. Accordingly, outputs from the fuse means F1–Fn will assume respective values produced by voltage division of VCIR by the transistors N31–N3n that are taken as high-resistance resistors and the fuse resistors R31–R3n. These outputs therefore are all fixed at a level very near to HIGH. As a result, all the transistors SW31–SW3n of the memory blocks M1–Mn are placed into the ON state, and the output of the NAND circuit NA4, i.e., SIGNAL SCB, becomes LOW thereby turning off the transistor SW3Y of the spare memory block 235. As a result, current paths for the operation of the memory blocks M1–Mn are secured and a current path for the operation of the spare memory block 235 is cut off, whereupon each memory block enters the operation state to operate.

Next, a situation, in which the first memory block 232 is judged to be a faulty memory block, is considered. In this case, it is possible to specify a faulty circuit block from data in the reference current determination memory when the block test result T becomes HIGH. A fuse resistor regarding the first memory block 232, i.e., the fuse resistor R31, is disconnected therefrom. Such disconnection of the fuse resistor R31 may be carried out using techniques such as high-voltage application and laser which exert no influence on the other elements. As a result, the output of the fuse means F1 is pulled down to GND by the transistor N31 that is taken as a high-resistance resistor, being fixed at the level of LOW. The transistor SW31 of the first memory block 232 then turns off. On the other hand, since the output of the fuse means F1 becomes LOW (i.e., one input of the NAND circuit NA4), the NAND circuit NA4 provides a HIGH as SIGNAL SCB. Because of this, the transistor SW3Y of the memory block 235 turns on. Whereas the current path for the operation of the first memory block 232 (i.e., the faulty memory block) is cut off, the current path for the operation of the spare memory block 235 is secured. As a result, the spare memory block 235 operates in place of the first memory block 232.

In accordance with the present modified version, a memory block, found by testing to be faulty, is replaced by a spare memory block. This provides semiconductor integrated circuits capable of being restored to normal operation by such replacement.

The transistor SW3Y of the spare memory block 235 is controlled based on the output of the fuse means F1–Fn, using a NAND circuit. There is provided a single spare memory block for a plurality of regular memory blocks. When there is a faulty memory block in the regular memory blocks, such a faulty memory block is replaced by the spare memory block.

The description has been made in terms of memory blocks. However, for the case of different types of circuit blocks such as logical circuits, spare logical circuits may be disposed.

In the foregoing description, one spare circuit block is provided to n circuit blocks. Every circuit block may be provided with a respective spare circuit block. A plurality of spare circuit blocks may be disposed correspondingly to a plurality of circuit blocks. In the latter case, as the plurality of spare circuit blocks, identical circuit blocks may be provided. Spare circuit blocks of different types formed of circuit blocks, such as memory blocks, of the same type may be provided.

Further, circuit block replacement may be carried out whenever a HIGH (fault) is provided as the block test result T in testing each circuit block. Alternatively, batch circuit block replacement may be carried out in which circuit blocks that have caused application of a HIGH (fault) to the register circuit 250 are all replaced with spare circuit blocks at one time.

Additionally, it is designed such that only one or more circuit blocks that are highly susceptible to fail to operate normally are provided with corresponding spare circuit blocks.

In accordance with the present embodiment, high-Vth MOS transistors disposed to turn off circuit blocks of low-Vth MOS transistors at the standby mode of operation are used to select from among the circuit blocks a test-target circuit block. A circuit current flowing in the selected circuit block is detected. When the detected current exceeds the reference value, it is determined that such a selected circuit block fails to operate normally. As a result of such arrangement, the number of circuit blocks that are tested at one time is limited without newly providing additional switch means, whereupon testing such as IDDQ testing on circuits formed of low-Vth MOS transistors can be realized.

Further, a circuit block that fails to operate normally is replaced by a spare circuit block. This provides semiconductor integrated circuits that are not subjected to immediate discard even when there occurs a fault therein and that can be restored to normal operation, thereby enhancing production yield.

Leakage current is judged per circuit block, which makes it possible to easily specify, from among circuit blocks, a circuit block with a leakage current in excess of the reference value. This provides semiconductor integrated circuits capable of easy circuit block evaluation, fault analysis, and so on.

Arrangement may be made in which only the circuit block switch parts 220A and 220B and the test-target circuit 230 are provided on a chip and a specific pad is used to apply SIGNALS S11–S61 from outside a wafer on which the chip is formed. Additionally, it is possible to examine the detected currents I11–I61 from outside the wafer. This achieves testing such as IDDQ testing on circuits formed of low-Vth MOS transistors without involving increases in chip area.

In addition to the above, it is possible to test a plurality of circuit blocks at the same time by use of the block selection data BS of bits of which a plurality of desired bits are set at HIGH and by adequately setting a reference value. As a result of such arrangement, the number of times a circuit block test is carried out can be reduced, for it is sufficient that individual testing of the circuit blocks is carried out only when such simultaneous testing gives an indication of fault. Further, it becomes possible to perform testing on circuit blocks in the same situation that they are actually used.

In addition to the above, each circuit block may be provided with the test circuit 240 and the block test result T and parallel input may be applied to the register circuit 250. This arrangement makes it possible to increase the number of circuit blocks that can be tested at the same time.

In the structure shown in FIG. 17, the reference current determination memory 242 has only one type of parallel data. Arrangement may be made in which a memory capable of storing a plurality of different items of parallel data is provided to select therebetween. Further, without formation of a memory on a chip, it is possible to provide parallel data to the circuit 243 from outside a wafer on which the chip is formed.

In the foregoing description, the ON state of the transistors THP11–THP61 secures current paths used during the normal mode of operation and the ON state of the NMOS transistors THN11–THN61 secures current paths used during the test mode of operation, the transistors THP11–THP61 and THN11–THN61 being disposed on the side towards which currents flow from the circuit blocks, and SIGNALS TE and S are positive logic; however, these are not considered restrictive. For example, in each circuit block a current path, through which VCIR is supplied, is provided with a high-Vth PMOS transistor in place of a transistor THP and with a high-Vth NMOS transistor in place of a transistor THN for switching between a circuit path used during the normal mode of operation and a circuit path used during the test mode of operation.

The structure of the present embodiment is used to establish disconnection from or connection to a power supply circuit and, in addition, to access a circuit block at the time of real use. When a semiconductor integrated circuit receives the address of a faulty circuit block at the time of real use, it is required that a spare circuit block is selected for the faulty circuit block. Suppose here that there exists a faulty circuit block. In such a case, with data indicative of the faulty circuit block retained in the register circuit 250, the retained data and the decoded address of an access-target circuit block are compared. If an indication of agreement is given, this means that the access-target circuit block fails to operate normally. Therefore, arrangement in circuit structure may be made in advance in order that a spare circuit block may become a target for access in place of the faulty circuit block.

What is claimed is:

1. A semiconductor integrated circuit comprising:

a test-target circuit, constructed of a plurality of circuit blocks each including MOS transistors having a first threshold voltage, for being subjected to a test;

power supply line switch means, disposed on a power supply line of each said circuit block and constructed of MOS transistors having a second threshold voltage in excess of said first threshold voltage, for switching a path of a current flowing in each said circuit block to a normal current path or to a test mode current path;

circuit block selection means for selecting from among said plurality of circuit blocks a desired circuit block that is required to make a switch in current path to said test mode current path during a test mode of operation; and test means for generating, at the time when the value of a current flowing in said switched test mode current path in said selected circuit block exceeds a predetermined reference value, a specified signal indicating that said selected circuit block fails to operate normally.

2. The semiconductor integrated circuit according to claim 1 wherein said test means includes reference value generation means for generating in advance reference values corresponding to said plurality of circuit blocks respectively.

3. The semiconductor integrated circuit according to claim 2, wherein said reference value generation means has power supply lines for the generation of said reference values which are different from power supply lines for the supply of voltage to said plurality of circuit blocks.

4. The semiconductor integrated circuit according to claim 3 further comprising:

a terminal for supplying, from outside said semiconductor integrated circuit, voltage to said power supply lines for the supply of voltage to said plurality of circuit blocks; and a terminal for supplying, from outside said semiconductor integrated circuit, voltage to said power supply lines for the generation of said reference values.

5. The semiconductor integrated circuit according to claim 2, wherein said reference value generation means includes:

voltage division means for dividing a reference voltage received in order to generate said reference value; and storage means for holding necessary data in said reference voltage division.

6. The semiconductor integrated circuit according to claim 2, wherein said reference value generation means includes means for generating said reference values of plural accuracy ratings correspondingly to said plurality of circuit blocks respectively.

7. The semiconductor integrated circuit according to claim 1, wherein said test-target circuit is constructed of a CMOS integrated circuit.

8. The semiconductor integrated circuit according to claim 1, wherein said circuit block selection means includes a scan register for receiving a signal and sequentially shifting said received signal to generate a block selection signal used to select said desired circuit block.

9. The semiconductor integrated circuit according to claim 1, wherein said test means includes means for simultaneously testing a plurality of circuit blocks selected by said circuit block selection means from among said plurality of circuit blocks.

10. The semiconductor integrated circuit according to claim 1 further comprising:

a spare circuit block having the same circuit structure as at least one of said plurality of circuit blocks; and switch means for replacing, when a specified signal is generated indicating that a circuit block in said plurality of circuit blocks that has the same structure as said spare circuit block fails to operate normally, said faulty circuit block with said spare circuit block.

11. The semiconductor integrated circuit according to claim 1, wherein said test means further includes stop means for stopping said test mode operation when a specified signal is generated indicating that said circuit block fails to operate normally.

* * * * *